(12) United States Patent  
Yang et al.

(10) Patent No.: US 8,558,007 B2
(45) Date of Patent: Oct. 15, 2013

(54) POLYMER AND ORGANIC LIGHT EMITTING DEVICE INCLUDING POLYMER

(75) Inventors: Hye-yeon Yang, Seoul (KR); Won-jae Joo, Seongnam-si (KR); Jhun-mo Son, Yongin-si (KR); Ho-suk Kang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 243 days.

(21) Appl. No.: 12/909,564

(22) Filed: Oct. 21, 2010

(65) Prior Publication Data

US 2011/0175068 A1  Jul. 21, 2011

(30) Foreign Application Priority Data

Jan. 15, 2010 (KR) .................. 10-2010-0003941

(51) Int. Cl.
*C07D 209/82* (2006.01)

(52) U.S. Cl.
USPC ........... 548/440; 548/446; 548/439; 548/441; 257/40; 257/E51.028; 528/423

(58) Field of Classification Search
USPC .................. 548/440, 446, 439, 441; 257/40, 257/E51.028; 528/423
See application file for complete search history.

(56) References Cited

FOREIGN PATENT DOCUMENTS

| CN | 101220197 A | 7/2008 |
|---|---|---|
| JP | 1999-144873 A | 5/1999 |
| JP | 2000-302756 A | 10/2000 |
| JP | 2005-071909 A | 3/2005 |
| JP | 2006-056841 A | 3/2006 |
| JP | 2006-077058 | * 3/2006 |
| WO | WO2006025290 A1 | 3/2006 |
| WO | 2006/070185 A1 | 7/2006 |
| WO | 2006/096399 A2 | 9/2006 |

OTHER PUBLICATIONS

Chen, Y.C. et al., High Triplet Energy Polymer as Host for Electrophosphorescence with High Efficiency, J. Am Chem Soc. Jul. 5, 2006;128(26): pp. 8549-8558.
EP Extended Search Report; Application No. 11150245.6-2102 dated May 11, 2011.

(Continued)

*Primary Examiner* — Shane Fang
(74) *Attorney, Agent, or Firm* — Cantor Colburn LLP

(57) ABSTRACT

A polymer and an organic light-emitting device including the polymer are provided, wherein the polymer comprises a polymeric unit represented by the Formula:

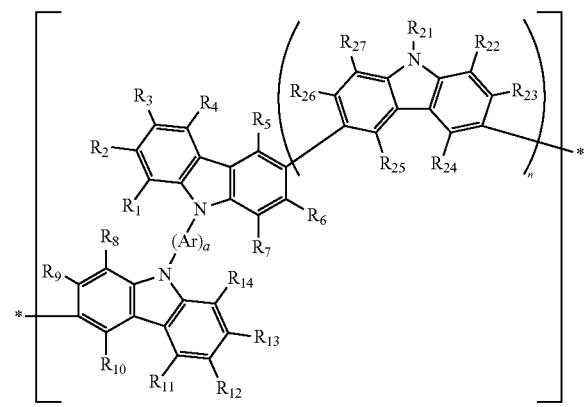

In which variables are as defined herein.

38 Claims, 6 Drawing Sheets

(56) References Cited

OTHER PUBLICATIONS

XP002634549 "Method for preparing hyperbranched aromatic polymers containing pyridine rings," retrieved from STN database accession No. 2008: 873090 (Jul. 16, 2008).

XP002634551 "Charge carrier material, organic electroluminescent element, and indicator panel," retrieved from STN database accession No. 2005: 235606 (Mar. 17, 2005).

Souharce, B., et al., Amorphous Carbazole-based (Co)polymers for OFET Application, Macromolecular Rapid Communications, 2009, vol. 30 (14): 1258-1262.

Anemian, R. et al., Optical limiting in the visible range: molecular engineering around N4, N4'-bis(4-methoxyphenyl)-N4, N4'-diphenyl-4,4'-diaminobiphenyl, J. Mater. Chem., 2003; 13: 2157-2163.

Chen, Y.C et al., High Triplet Energy Polymer as Host for Electrophosphorescence with High Efficiency, J Am Chem Soc. 2006; 128(26): 8549-8558.

Gotou, Y. et al., Fluorene Derivatives with High Hole Mobility, Molecular Crystals and Liquid Crystals, 2006; 444: 185-190.

Lou, S. et al., Organic light-emitting devices based on different hole transport materials, Proceedings of the SPIE, 2007, vol. 6722: 67221O-1-6.

Marsal, P. et al., Molecular hosts for triplet emission in light emitting diodes: A quantum-chemical study, Chemical Physics Letters 392, 2004: 521-528.

* cited by examiner

POLYMER AND ORGANIC LIGHT EMITTING DEVICE INCLUDING POLYMER

CROSS-REFERENCE TO RELATED APPLICATIONS

This application claims priority to Korean Patent Application No. 10-2010-0003941, filed on Jan. 15, 2010, and all the benefits accruing therefrom under 35 U.S.C. §119, the content of which in its entirety is herein incorporated by reference.

BACKGROUND

1. Field

The present disclosure relates to polymers and organic light-emitting devices including the polymers.

2. Description of the Related Art

Organic light-emitting devices include a pair of electrodes and an organic layer interposed between the electrodes, such that, when a current is supplied to the electrodes, electrons and holes injected from the electrodes are re-combined in the organic layer, thereby emitting light. Accordingly, organic light-emitting devices are self-emitting devices. Organic light-emitting devices are lightweight, and may be easily manufactured using a relatively small number of components. In addition, organic light-emitting devices provide high-quality images and have wide viewing angles. Furthermore, organic light-emitting devices provide high color purity, accurately realize moving pictures, have low power consumption, and are operated at low voltage. Due to these characteristics, organic light-emitting devices are suitable for mobile electronic devices.

A typical organic light-emitting device has a structure including a substrate, an anode, organic layers, and a cathode which are sequentially stacked on the substrate, wherein the organic layers include a hole transport layer ("HTL"), an emission layer ("EML"), and an electron transport layer ("ETL").

When a voltage is applied to the anode and the cathode, holes injected from the anode move to the EML via the HTL, and electrons injected from the cathode move to the EML via the ETL. The holes and electrons recombine in the EML to generate excitons. The excitons radioactively decay to emit light having a wavelength corresponding to the band gap of a material.

Materials used to form organic layers may be classified as either vacuum-depositable materials or solution-coatable materials according to the method used to form the organic layer. Solution-coatable materials should be miscible with a solvent to form a composition that may be coated on a substrate by a known solution coating method, such as inkjet printing, screen printing, or spin coating.

SUMMARY

Provided herein are polymers having a novel structure, and organic light-emitting devices including the polymers.

According to an aspect of the present invention, there is provided a polymer comprising a polymeric unit represented by Formula 1 below:

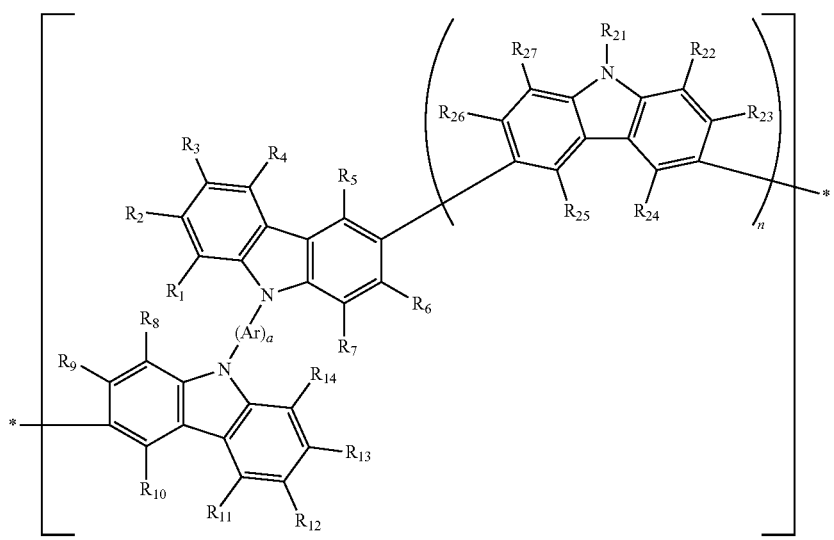

wherein each Ar is independently selected from a substituted or unsubstituted $C_6$-$C_{30}$ arylene group and a substituted or unsubstituted $C_3$-$C_{30}$ heteroarylene group;

a is an integer ranging from 1 to about 3;

Each of $R_1$ to $R_{14}$ and $R_{21}$ to $R_{27}$ is independently selected from a hydrogen atom, a halogen atom, a hydroxyl group, an amino group, a cyano group, a carboxylic acid group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_6$-$C_{30}$ aryl group, a substituted or unsubstituted $C_3$-$C_{30}$ heteroaryl group, a group represented by —N($Q_1$)($Q_2$), and a group represented by —Si($Q_3$)($Q_4$)($Q_5$), wherein each of $Q_1$ to $Q_5$ is independently selected from a hydrogen atom, a halogen atom, a hydroxyl group, an amino group, a cyano group, a carboxylic acid group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_6$-$C_{30}$ aryl group, and a substituted or unsubstituted $C_3$-$C_{30}$ heteroaryl group;

n is an integer ranging from 0 to about 5, and each "*" indicates a point of attachment to the same or a different polymeric unit represented by Formula 1.

According to another aspect of the present invention, an organic light-emitting device includes a substrate; a first electrode; a second electrode; and a first layer disposed between the first electrode and the second electrode, the first layer including the polymer described above.

BRIEF DESCRIPTION OF THE DRAWINGS

These and/or other aspects will become apparent and more readily appreciated from the following description of representative embodiments, taken in conjunction with the accompanying drawings of which.

DETAILED DESCRIPTION

Figure 1:
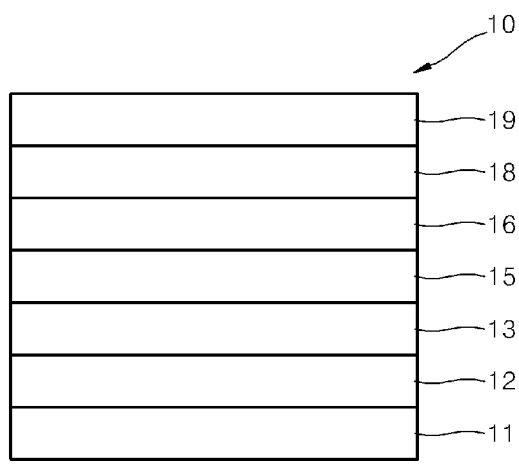
FIG. 1 is a schematic sectional view of an organic light-emitting device according to a representative embodiment of the present invention.

The disclosure will be described more fully hereinafter in the following detailed description of the invention, in which some but not all embodiments of the disclosure are described. In this regard, the present embodiments may have different forms and should not be construed as being limited to the descriptions set forth herein; rather, these embodiments are provided so that this disclosure will be thorough and complete, and will fully convey the scope of the invention to those skilled in the art. Like reference numerals refer to like elements throughout.

In the drawings, the thickness of layers, films, panels, regions, etc., may be exaggerated for clarity.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer or section. Thus, a first element, component, region, layer, or section discussed below could be termed a second element, component, region, layer, or section without departing from the teachings of the present invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

According to an aspect of the present invention, provided is a polymer comprising a polymeric unit represented by Formula 1 below:

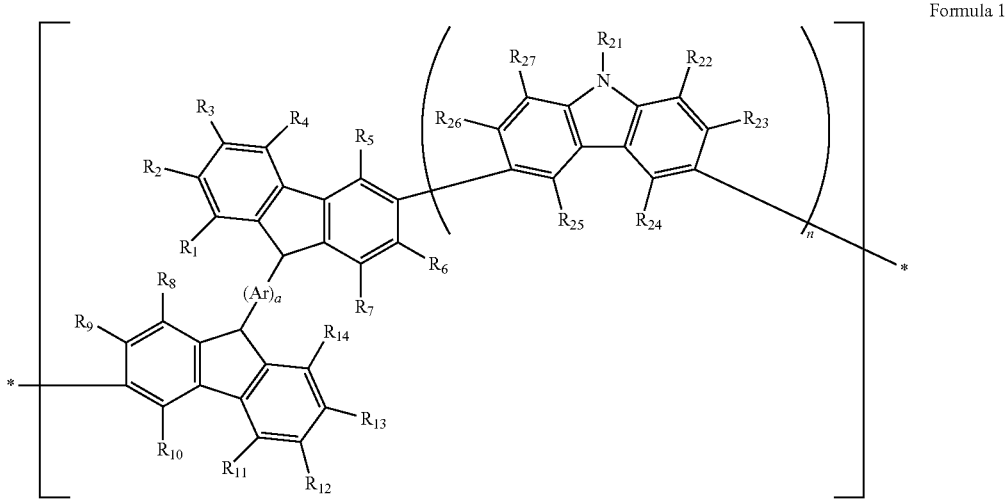

Formula 1 wherein each Ar may be independently a substituted or unsubstituted $C_6$-$C_{30}$ arylene group or a substituted or unsubstituted $C_3$-$C_{30}$ heteroarylene group; a is an integer ranging from 1 to about 3;

each of $R_1$ to $R_{14}$ and $R_{21}$ to $R_{27}$ is independently selected from a hydrogen atom, a halogen atom, a hydroxyl group, an amino group, a cyano group, a carboxylic acid group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_6$-$C_{30}$ aryl group, a substituted or unsubstituted $C_3$-$C_{30}$ heteroaryl group, a group represented by —N($Q_1$)($Q_2$), and a group represented by —Si($Q_3$)($Q_4$)($Q_5$), wherein each of $Q_1$ to $Q_5$ is independently selected from a hydrogen atom, a halogen atom, a hydroxyl group, an amino group, a cyano group, a carboxylic acid group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_6$-$C_{30}$ aryl group, and a substituted or unsubstituted $C_3$-$C_{30}$ heteroaryl group;

n is an integer ranging from 0 to about 5; and each "*" indicates a point of attachment to the same or a different polymeric unit represented by Formula 1.

In certain representative embodiments, each Ar may be independently selected from a substituted or unsubstituted phenylene group, a substituted or unsubstituted pentalenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene group, a substituted or unsubstituted phenalenylene group, a substituted or unsubstituted phenanthrenylene group, a substituted or unsubstituted anthracenylene group, a substituted or unsubstituted fluoranthenylene group, a substituted or unsubstituted triphenylenylene group, a substituted or unsubstituted pyrenylenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentaphenylene group, a substituted or unsubstituted hexacenylene group, a substituted or unsubstituted pyrrolylene group, a substituted or unsubstituted pyrazolylene group, a substituted or unsubstituted imidazolylene group, a substituted or unsubstituted imidazolinylene group, a substituted or unsubstituted imidazopyridinylene group, a substituted or unsubstituted imidazopyrimidinylene group, a substituted or unsubstituted pyridinylene group, a substituted or unsubstituted pyrazinylene group, a substituted or unsubstituted pyrimidinylene group, a substituted or unsubstituted indolylene group, a substituted or unsubstituted purinylene group, a substituted or unsubstituted quinolinylene group, a substituted or unsubstituted phthalazinylene group, a substituted or unsubstituted indolizinylene group, a substituted or unsubstituted naphthyridinylene group, a substituted or unsubstituted quinazolinylene group, a substituted or unsubstituted cinnolinylene group, a substituted or unsubstituted indazolylene group, a substituted or unsubstituted carbazolylene group, a substituted or unsubstituted phenazinylene group, a substituted or unsubstituted phenanthridinylene group, a substituted or unsubstituted pyranylene group, a substituted or unsubstituted chromenylene group, a substituted or unsubstituted benzofuranylene group, a substituted or unsubstituted thiophenylene group, a substituted or unsubstituted benzothiophenylene group, a substituted or unsubstituted isothiazolylene group, a substituted or unsubstituted benzoimidazolylene group, and a substituted or unsubstituted isoxazolylene group.

In further representative embodiments, each Ar may be independently selected from a substituted or unsubstituted $C_6$-$C_{14}$ arylene group and a substituted or unsubstituted $C_3$-$C_{14}$ heteroarylene group.

Within other representative embodiments, each Ar may be independently selected from a phenylene group, a $C_1$-$C_{10}$ alkylphenylene group, a di($C_1$-$C_{10}$ alkyl)phenylene group, a ($C_6$-$C_{14}$ aryl)phenylene group, a di($C_6$-$C_{14}$ aryl)phenylene group, a carbazolylene group, a $C_1$-$C_{10}$ alkylcarbazolylene group, a di($C_1$-$C_{10}$ alkyl)carbazolylene group, a $C_6$-$C_{14}$ arylcarbazolylene group, a di($C_6$-$C_{14}$ aryl)carbazolylene group, a fluorenylene group, a $C_1$-$C_{10}$ alkylfluorenylene group, a di($C_1$-$C_{10}$ alkyl)fluorenylene group, a ($C_6$-$C_{14}$ aryl)fluorenylene group, a di($C_6$-$C_{14}$ aryl)fluorenylene group, a naphthylene group, a $C_1$-$C_{10}$ alkylnaphthylene group, a di($C_1$-$C_{10}$ alkyl)naphthylene group, a ($C_6$-$C_{14}$ aryl)naphthylene group, a di($C_6$-$C_{14}$ aryl)naphthylene group, an anthrylene group, a $C_1$-$C_{10}$ alkylanthrylene group, a di($C_1$-$C_{10}$ alkyl)anthrylene group, a ($C_6$-$C_{14}$ aryl)anthrylene group, a di($C_6$-$C_{14}$ aryl)anthrylene group, a phenanthrenylene group, a $C_1$-$C_{10}$ alkylphenanthrenylene group, a di($C_1$-$C_{10}$ alkyl)phenanthrenylene group, a ($C_6$-$C_{14}$ aryl)phenanthrenylene group, a di($C_6$-$C_{14}$ aryl)phenanthrenylene group, a pyridinylene group, a $C_1$-$C_{10}$ alkylpyridinylene group, a di($C_1$-$C_{10}$ alkyl)pyridinylene group, a ($C_6$-$C_{14}$ aryl)pyridinylene group, a di($C_6$-$C_{14}$ aryl)pyridinylene group, a quinolinylene group, a $C_1$-$C_{10}$ alkylquinolinylene group, a di($C_1$-$C_{10}$ alkyl)quinolinylene group, a ($C_6$-$C_{14}$ aryl)quinolinylene group, a di($C_6$-$C_{14}$ aryl)quinolinylene group, a benzoimidazolylene group, a $C_1$-$C_{10}$ alkylbenzoimidazolylene group, a di($C_1$-$C_{10}$ alkyl)benzoimidazolylene group, a ($C_6$-$C_{14}$ aryl)benzoimidazolylene group, a di($C_6$-$C_{14}$ aryl)benzoimidazolylene group, an imidazopyridinylene group, a $C_1$-$C_{10}$ alkylimidazopyridinylene group, a di($C_1$-$C_{10}$ alkyl)imidazopyridinylene group, a ($C_6$-$C_{14}$ aryl)imidazopyridinylene group, a di($C_6$-$C_{14}$ aryl)imidazopyridinylene group, an imidazopyrimidinylene group, a $C_1$-$C_{10}$ alkylimidazopyrimidinylene group, a di($C_1$-$C_{10}$ alkyl)imidazopyrimidinylene group, a ($C_6$-$C_{14}$ aryl)imidazopyrimidinylene group, and a di($C_6$-$C_{14}$ aryl)imidazopyrimidinylene group. In this regard, examples of the $C_1$-$C_{10}$ alkyl group include, but are not limited to, a methyl group, an ethyl group, a linear or branched propyl group, a linear or branched butyl group, a linear or branched pentyl group, a linear or branched hexyl group, a linear or branched heptyl group and a linear or branched octyl group. Examples of the $C_6$-$C_{14}$ aryl group include, but are not limited to, a phenyl group, a naphthyl group, an anthryl group, and a fluorenyl group.

In Formula 1, the variable "a" denotes a repeat number of —Ar—, and may be an integer ranging from 1 to about 3 (i.e., 1, 2, or 3), and each —Ar— may be the same as or different from each other when a is 2 or 3.

In certain representative embodiments of Formula 1 above, —(Ar)$_a$— may be represented by one of Formulae 2A to 2K below:

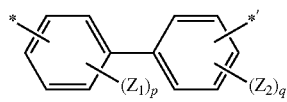

Formula 2A

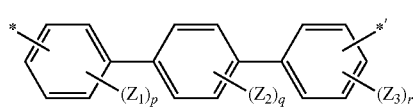

Formula 2B

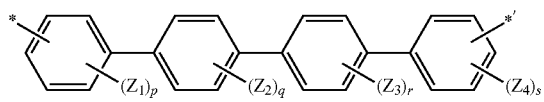

Formula 2C

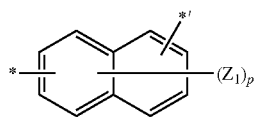

Formula 2D

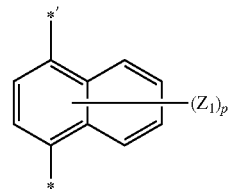

Formula 2E

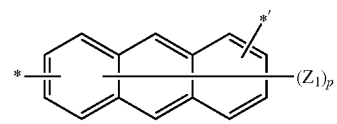

Formula 2F

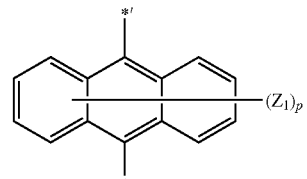

Formula 2G

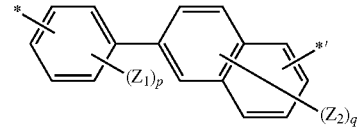

Formula 2H

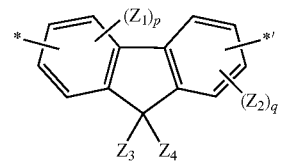

Formula 2I

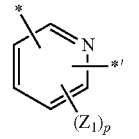

Formula 2J

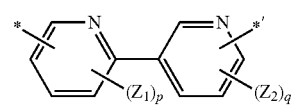

Formula 2K

In Formulae 2A to 2K above, each of $Z_1$ to $Z_4$ may be independently selected from a hydrogen atom, a $C_1$-$C_{10}$ alkyl group (for example, a methyl group, an ethyl group, a linear or branched propyl group, a linear or branched butyl group, a linear or branched pentyl group, a linear or branched hexyl group, a linear or branched heptyl group, or a linear or branched octyl group), and a $C_6$-$C_{14}$ aryl group (for example, a phenyl group, a naphthyl group, or an anthryl group).

In Formulae 2A to 2K above, each of p, q, r and s may be independently an integer ranging from 1 to about 8.

In Formulae 2A to 2K above, * indicates a binding site to N of an adjacent carbazole ring in Formula 1, and *' indicates a binding site to N of the other adjacent carbazole ring in Formula 1. This will be easily understood by one of ordinary skill in the art with reference to the structure of Formula 1.

For example, in certain representative embodiments of Formulae 2A to 2K, each of $Z_1$ to $Z_4$ may be a hydrogen atom.

In further representative embodiments of Formula 1 above, each of $R_1$ to $R_{14}$ and $R_{21}$ to $R_{27}$ may be independently selected from a hydrogen atom, a halogen atom, a hydroxyl group, an amino group, a cyano group, a carboxylic acid, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_6$-$C_{30}$ aryl group, a substituted or unsubstituted $C_3$-$C_{30}$ heteroaryl group, a group represented by —N($Q_1$)($Q_2$), and a group represented by —Si($Q_3$)($Q_4$)($Q_5$), wherein each of $Q_1$ to $Q_5$ may be independently selected from a hydrogen atom, a halogen atom, a hydroxyl group, an amino group, a cyano group, a carboxylic acid group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_6$-$C_{30}$ aryl group, and a substituted or unsubstituted $C_3$-$C_{30}$ heteroaryl group. For example, in certain representative embodiments, each of $Q_1$ to $Q_5$ may be independently selected from a hydrogen atom, a halogen atom, a hydroxyl group, an amino group, a cyano group, a carboxylic acid group, a $C_1$-$C_{10}$ alkyl group, a $C_2$-$C_{10}$ alkenyl group, a $C_2$-$C_{10}$ alkynyl group, a $C_1$-$C_{10}$ alkoxy group, a $C_6$-$C_{14}$ aryl group, and a $C_3$-$C_{14}$ heteroaryl group.

Within further representative embodiments of Formula 1 above, each of $R_1$ to $R_{14}$ and $R_{21}$ to $R_{27}$ may be independently selected from a hydrogen atom, a halogen atom, a hydroxyl group, an amino group, a cyano group, a carboxylic acid group, a substituted or unsubstituted $C_1$-$C_{10}$ alkyl group, a substituted or unsubstituted $C_2$-$C_{10}$ alkenyl group, a substituted or unsubstituted $C_2$-$C_{10}$ alkynyl group, a substituted or unsubstituted $C_1$-$C_{10}$ alkoxy group, a substituted or unsubstituted $C_6$-$C_{14}$ aryl group and a substituted or unsubstituted $C_3$-$C_{14}$ heteroaryl group.

Within still further representative embodiments of Formula 1 above, each of $R_1$ to $R_2$, $R_4$ to $R_{11}$, $R_{13}$ to $R_{14}$, and $R_{22}$ to $R_{27}$ may be a hydrogen atom; and each of $R_3$, $R_{12}$, and $R_{21}$ may be independently selected from a hydrogen atom, a halogen atom, a hydroxyl group, an amino group, a cyano group, a carboxylic acid group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_6$-$C_{30}$ aryl group, a substituted or unsubstituted $C_3$-$C_{30}$ heteroaryl group, a group represented by —N($Q_1$)($Q_2$), and a group represented by —Si($Q_3$)($Q_4$)($Q_5$), wherein $Q_1$ to $Q_5$ may be each independently selected from a hydrogen atom, a halogen atom, a hydroxyl group, an amino group, a cyano group, a carboxylic acid group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_6$-$C_{30}$ aryl group, and a substituted or unsubstituted $C_3$-$C_{30}$ heteroaryl group.

In other representative embodiments of Formula 1 above, each of $R_1$ to $R_2$, $R_4$ to $R_{11}$, $R_{13}$ to $R_{14}$, and $R_{22}$ to $R_{27}$ may be a hydrogen atom; and each of $R_3$, $R_{12}$, and $R_{21}$ may be independently selected from a hydrogen atom, a halogen atom, a hydroxyl group, an amino group, a cyano group, a carboxylic acid group, a $C_1$-$C_{10}$ alkyl group (for example, a methyl group, an ethyl group, a linear or branched propyl group, a linear or branched butyl group, a linear or branched pentyl group, a linear or branched hexyl group, a linear or branched heptyl group, a linear or branched octyl group, or the like), a $C_1$-$C_{10}$ alkoxy group (for example, a methoxy group, an ethoxy group, a linear or branched propoxy group, a linear or branched butoxy group, a linear or branched pentoxy group or the like), a $C_6$-$C_{14}$ aryl group (for example, a phenyl group, a naphthyl group, an anthryl group, a fluorenyl group or the like), and a $C_3$-$C_{14}$ heteroaryl group (for example, a carbazolyl group, a pyridinyl group, or the like).

In Formula 1 above, n may be an integer from 0 to 5. For example, in certain representative embodiments, n may be 0, 1, or 2, but is not limited thereto.

The polymer may, in certain representative embodiments, comprise a polymeric unit represented by any one of the following Formulae 1A, 1B and 1C:

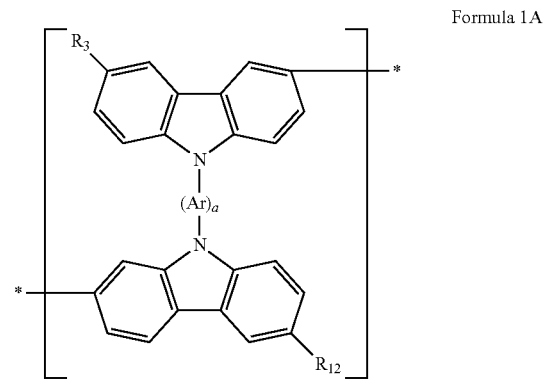

Formula 1A

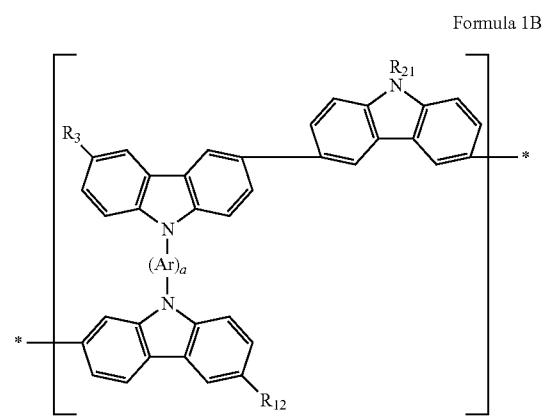

Formula 1B

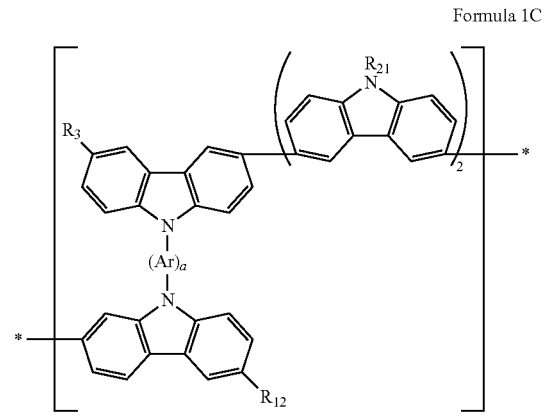

Formula 1C

In Formulae 1A to 1C, Ar, a, $R_3$, $R_{12}$, and $R_{21}$ are as described above.

In Formulae 1A to 1C above, a may be 1, 2, or 3.

In Formulae 1A to 1C above, —(Ar)$_a$— may, within certain representative embodiments, be represented by one of the Formulae 2A to 2K.

In Formulae 1A to 1C above, each of $R_3$, $R_{12}$, and $R_{21}$ may, within certain representative embodiments, be independently selected from a hydrogen atom, a halogen atom, a hydroxyl group, an amino group, a cyano group, a carboxylic acid group, a $C_1$-$C_{10}$ alkyl group (for example, a methyl group, an ethyl group, a linear or branched propyl group, a linear or branched butyl group, a linear or branched pentyl group, a linear or branched hexyl group, a linear or branched heptyl group, a linear or branched octyl group, or the like), a $C_1$-$C_{10}$ alkoxy group (for example, a methoxy group, an ethoxy group, a propoxy group, a butoxy group, a pentoxy group, or the like), a $C_6$-$C_{14}$ aryl group (for example, a phenyl group, a naphthyl group, an anthryl group, a fluorenyl group, or the like), and a $C_3$-$C_{14}$ heteroaryl group (for example, a carbazolyl group, a pyridinyl group, or the like).

In certain representative embodiments of Formulae 1A to 1C above, each of $R_3$, $R_{12}$, and $R_{21}$ may be independently selected from a hydrogen atom, a methyl group, an ethyl group, a linear or branched propyl group, a linear or branched butyl group, a linear or branched pentyl group, a linear or branched hexyl group, a linear or branched heptyl group and a linear or branched octyl group.

In certain representative embodiments of Formulae 1A to 1C above, —(Ar)$_a$— may be represented by Formula 2I above, each of $R_3$ and $R_{12}$ may be a hydrogen atom, and $R_{21}$ may be selected from a methyl group, an ethyl group, a linear or branched propyl group, a linear or branched butyl group, a linear or branched pentyl group, a linear or branched hexyl group, a linear or branched heptyl group and a linear or branched octyl group.

Within still further embodiments, the polymer may comprise a polymeric unit represented by one of Formulae 1A-1, 1B-1 and 1C-1 below:

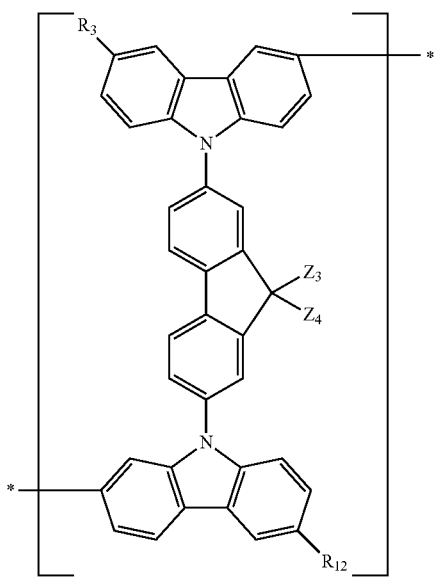

Formula 1A-1

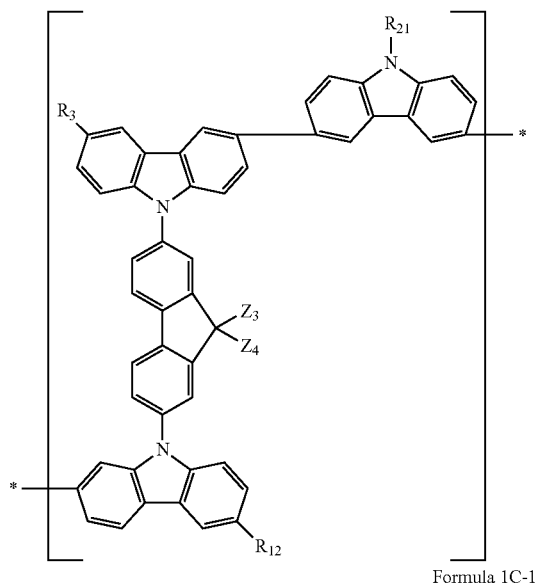

Formula 1B-1

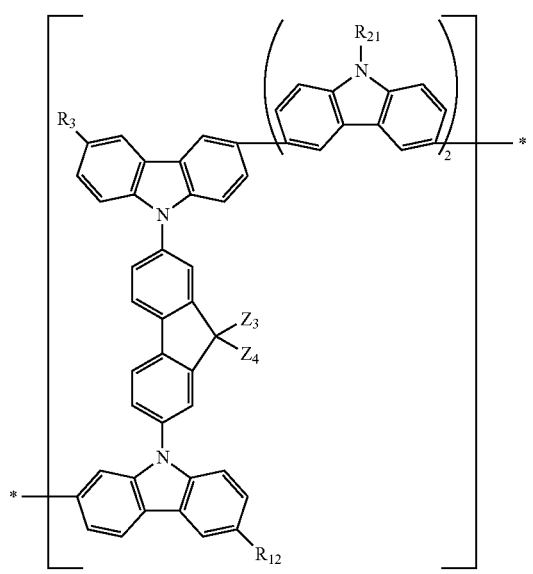

Formula 1C-1

In certain representative embodiments of Formulae 1A-1, 1B-1, and 1C-1 above, each of $R_3$, $R_{12}$, and $R_{21}$ may be independently selected from a hydrogen atom, a methyl group, an ethyl group, a linear or branched propyl group, a linear or branched butyl group, a linear or branched pentyl group, a linear or branched hexyl group, a linear or branched heptyl group and a linear or branched octyl group. In further representative embodiments of Formulae 1A-1, 1B-1, and 1C-1 above, $Z_3$ and $Z_4$ may be independently selected from a hydrogen atom, a $C_1$-$C_{10}$ alkyl group (for example, a methyl group, an ethyl group, a linear or branched propyl group, a linear or branched butyl group, a linear or branched pentyl group, a linear or branched hexyl group, a linear or branched heptyl group, or a linear or branched octyl group), and a $C_6$-$C_{14}$ aryl group (for example, a phenyl group, a naphthyl group, or an anthryl group). For example, $Z_3$ and $Z_4$ may be independently selected from a methyl group, an ethyl group, a linear or branched propyl group, a linear or branched butyl group, a linear or branched pentyl group, a linear or branched hexyl group, a linear or branched heptyl group, or a linear or branched octyl group, but are not limited thereto.

The polymer comprising the polymeric unit of Formula 1 may contain only units that satisfy Formula 1, with or without terminal moieties It will be apparent that each of the units satisfying Formula 1 within such a polymer may be the same or different. Alternatively, the polymer may comprise one or more polymeric units of Formula 1 in combination with polymeric units of a different structure.

A weight average molecular weight of the polymer comprising the polymeric unit of Formula 1 may be in the range of, for example, about 2,000 to about 1,000,000 on the basis of polystyrene, and a polydispersity index ("PDI") thereof may be in the range of, for example, about 1.5 to about 5. The weight average molecular weight and PDI of the polymer may be selected based on considerations of the structure of an organic light emitting device including the polymer and the desired characteristics of the organic light emitting device.

The polymer comprising the polymeric unit of Formula 1 may have both hole and electron transport characteristics in its molecular structure. In Formula 1-1 below, two of the repeating units, which are collectively represented in "[ ]" in Formula 1, appear to be consecutively connected:

Formula 1-1
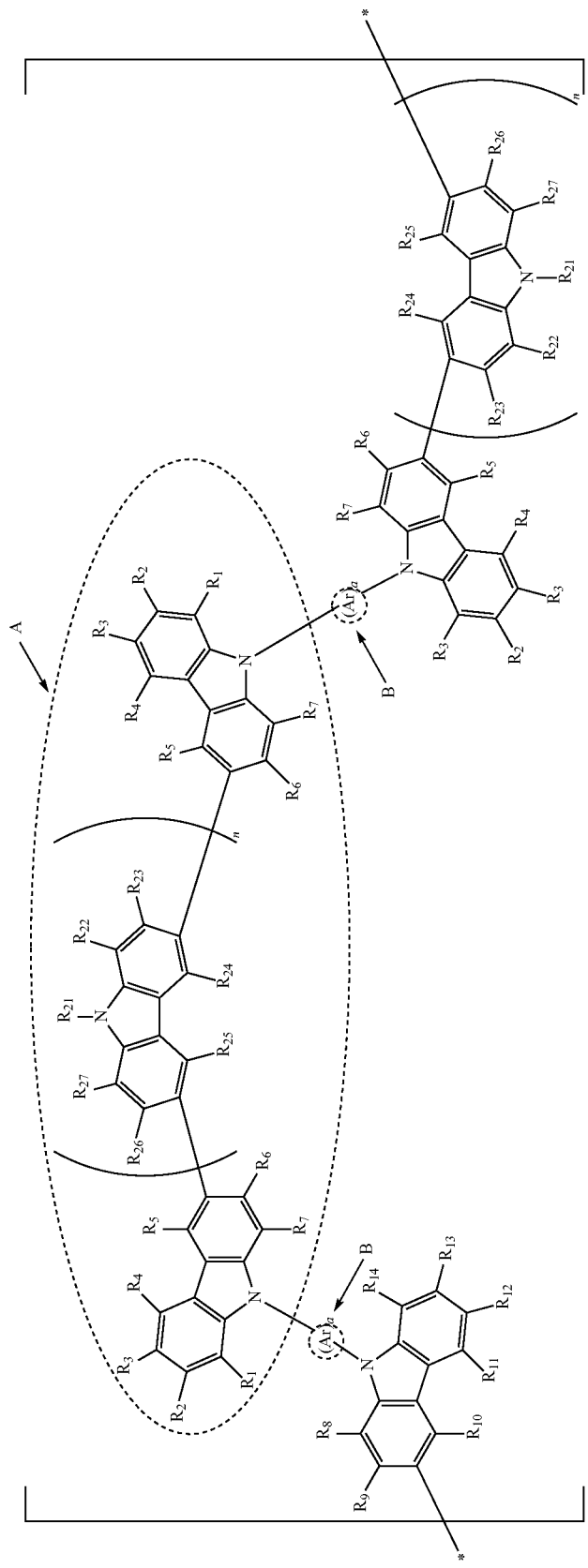

In Formula 1-1 above, carbazole rings in a region A may effectively transport holes. For example, n in the region A may be adjusted to control the transport of holes. In Formula 1-1, an arylene group and/or heteroarylene ring in a region B may effectively transport electrons.

Thus, the polymer comprising the polymeric unit of Formula 1 is a bipolar polymer with the abilities to transport both holes and electrons in its molecular structure, and thus effectively implement and maintain a balance of holes and electrons.

In addition, the polymer comprising the polymeric unit of Formula 1 may have a very high triplet state energy level. For example, carbazole rings linked at No. 3 and No. 6 carbon atoms of a carbazole ring in the region "A" may contribute to maintaining an energy band gap ("Eg") and a triplet state energy ("$E_T$") to be high even when a conjugation length in the region A is increased.

Thus, the polymer comprising the polymeric unit of Formula 1 may be used, for example, for an emission layer of an OLED together with a phosphorescent dopant, thereby contributing to emitting light according to a phosphorescence mechanism. In other words, since the polymer comprising the polymeric unit of Formula 1 may have bipolar characteristics and may be used as a phosphorescent host in the emission layer of the OLED, the polymer comprising the polymeric unit of Formula 1 may be referred to as a bipolar polymer for a phosphorescent host.

As used herein, unless otherwise provided, the term "substituted" refers to a compound or radical substituted with at least one (e.g., 1, 2, 3, 4, 5, 6, or more) substituents independently selected from a $C_1$-$C_{30}$ linear or branched alkyl, haloalkyl, alkenyl or alkynyl group, a $C_6$ to $C_{18}$ aryl, a halogen (e.g., F, Cl, Br, I), a $C_1$-$C_{30}$ alkoxy group, a $C_1$-$C_{10}$ alkylamino group, a $C_6$-$C_{14}$ arylamino group, a $C_6$-$C_{30}$ aryl group, a $C_3$-$C_{30}$ heteroaryl group, a hydroxy group, a nitro group, a cyano group, an amino group, an amidino group, hydrazine, hydrazone, a carboxyl group, a sulfonic acid group, a phosphoric acid group, or the like.

The term "alkyl" refers to a monovalent, straight or branched chain saturated aliphatic hydrocarbon. Alkyl groups include, for example, groups having from 1 to 30 carbon atoms ($C_1$-$C_{30}$ alkyl). Nonlimiting examples of the unsubstituted $C_1$-$C_{30}$ alkyl group include a methyl group, an ethyl group, a propyl group, an isobutyl group, a sec-butyl group, a pentyl group, an iso-amyl group, and a hexyl group. In the substituted $C_1$-$C_{30}$ alkyl group, at least one hydrogen atom is replaced with a halogen atom, a $C_1$-$C_{30}$ alkyl group, a $C_1$-$C_{30}$ alkoxy group, a $C_1$-$C_{10}$ alkylamino group, a $C_6$-$C_{14}$ arylamino group, a $C_6$-$C_{30}$ aryl group, a $C_3$-$C_{30}$ heteroaryl group, a hydroxyl group, a nitro group, a cyano group, an amino group, an amidino group, hydrazine, hydrazone, a carboxyl group, a sulfonic acid group, and a phosphoric acid group.

"Alkenyl," as used herein, is a monovalent, straight or branched chain hydrocarbon that includes at least one carbon-carbon double bond. An example of the unsubstituted $C_2$-$C_{30}$ alkenyl group may be an ethenyl group. In the substituted $C_2$-$C_{30}$ alkenyl group, at least one hydrogen atom is replaced with a substituent as described above in conjunction with the substituted $C_1$-$C_{30}$ alkyl group; multiple substituents, if present, are independently chosen.

"Alkoxy," as used herein, refers to an alkyl moiety that is linked via an oxygen (i.e., —O-alkyl). Nonlimiting examples of the unsubstituted $C_1$-$C_{30}$ alkoxy group include a methoxy group, an ethoxy group, a propoxy group, an isobutyloxy group, a sec-butyloxy group, a pentyloxy group, an iso-amyloxy group, and a hexyloxy group. In the substituted $C_1$-$C_{30}$ alkoxy group, at least one hydrogen atom is replaced with a substituent as described above in conjunction with the substituted $C_1$-$C_{30}$ alkyl group; multiple substituents, if present, are independently chosen.

Throughout the specification, the $C_6$-$C_{30}$ aryl group refers to a monovalent carbocyclic ring system, in which all ring members are carbon, including one or more aromatic rings. When the $C_6$-$C_{30}$ aryl group includes two or more rings, these rings may be attached to each other using a pendent method or may be fused together. Representative 'aryl' groups include, for example, phenyl, naphthyl, or tetrahydronaphthyl. In the substituted $C_6$-$C_{30}$ aryl group, one or more hydrogen atoms are replaced with a substituent as described above in conjunction with the substituted $C_1$-$C_{30}$ alkyl group; multiple substituents, if present, are independently chosen.

The $C_3$-$C_{30}$ heteroaryl group refers to a monovalent monocyclic ring moiety that comprises one or more rings, at least one of which is aromatic, and at least one of which comprises at least one heteroatom (e.g., one, two or three heteroatoms) such that the total number of ring carbon atoms ranges from 3 to 30. The heteroatom(s) are generally independently selected from nitrogen (N), oxygen (O), P (phosphorus), and sulfur (S), and the other ring atoms are carbons (C). In certain representative embodiments, the $C_3$-$C_{30}$ heteroaromatic group comprises from 5 to 35 total ring atoms. When the $C_2$-$C_{30}$ heteroaryl group has two or more rings, these rings may be attached to each other using a pendent method or may be fused together. Examples of the heteroaryl group include pyridyl, thienyl, and furyl. In the substituted $C_3$-$C_{30}$ heteroaryl group, at least one hydrogen atoms is replaced with a substituent as described above in conjunction with the substituted $C_1$-$C_{30}$ alkyl group; multiple substituents, if present, are independently chosen.

Throughout the specification, reference is made to various bivalent moieties. Such moieties are the same as the monovalent groups that are similarly named, and are typically indicated with an "ene" suffix. For example, the substituted or unsubstituted $C_6$-$C_{30}$ arylene group is a bivalent linking group having the same structure as the substituted or unsubstituted $C_6$-$C_{30}$ aryl group, and the substituted or unsubstituted $C_3$-$C_{30}$ heteroarylene group is a bivalent linking group having the same structure as the substituted or unsubstituted $C_3$-$C_{30}$ heteroaryl group.

Examples of the substituted or unsubstituted $C_6$-$C_{30}$ arylene group and the substituted or unsubstituted $C_3$-$C_{30}$ heteroarylene group will be easily understood by one of ordinary skill in the art with reference to those of the substituted or unsubstituted $C_6$-$C_{30}$ aryl group and the $C_3$-$C_{30}$ heteroaryl group described above.

The polymer comprising the polymeric unit of Formula 1 may be synthesized using a known method in the art, such as Suzuki coupling or Yamamoto coupling. This will be easily understood by one of ordinary skill in the art with reference to examples described later.

According to another embodiment of the present invention, an organic light-emitting device ("OLED") includes a substrate, a first electrode, a second electrode, and a first layer disposed between the first electrode and the second electrode, the first layer including the polymer comprising the polymeric unit of Formula 1 above.

The first layer may function as, for example, an emission layer.

If the first layer functions as an emission layer, the first layer may, but need not, further include a phosphorescent dopant. The phosphorescent dopant used in the first layer may be any known phosphorescent dopant. For example, the phosphorescent dopant may include an organometallic complex including at least one metal selected from iridium (Ir), platinum (Pt), osmium (Os), rhenium (Re), titanium (Ti), zirconium (Zr), and hafnium (Hf).

For example, in certain embodiments, the phosphorescent dopant may include at least one material selected bisthienylpyridine acetylacetonate iridium, bis(benzothienylpyridine)acetylacetonate iridium, bis(2-phenylbenzothiazole) acetylacetonate, bis(1-phenylisoquinoline) iridium acetylacetonate, tris(1-phenylisoquinoline) iridium, tris(phenylpyridine)iridium, tris(2-biphenylpyridine) iridium, tris(3-biphenyl pyridine) iridium, tris(4-biphenyl pyridine) iridium, Ir(pq)$_2$(acac) (wherein "pq" is an abbreviation for 2-phenylquinoline; and "acac" is an abbreviation for acetylacetone, see Compound 10 below), Ir(ppy)$_3$ (wherein "ppy" is an abbreviation for phenylpyridine, see Compound 11 below), platinum(II)octaethylporphyrin (PtOEP, see a compound below), Compound 12 below, Firpic (see Compound 13 below), Ir(piq)$_3$ (see a compound below), Ir(piq)$_2$acac (wherein "piq" is an abbreviation for phenylisoquinoline, see Compound 14 below), Btp$_2$Ir(acac) (see the indicated compound below), F$_2$Irpic (see the indicated compound below), (F$_2$ppy)$_2$Ir(tmd) (see the indicated compound below), and Ir(dfppz)$_3$ (see the indicated compound below):

Compound 10

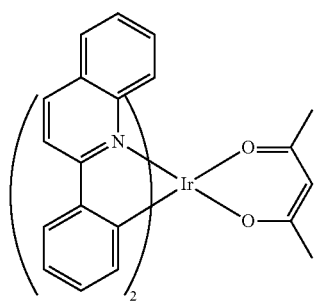

Pq$_2$Ir(acac)

Compound 11

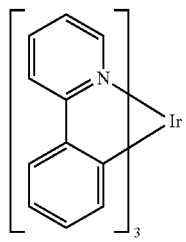

Compound 12

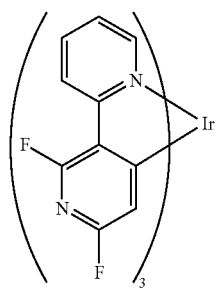

Compound 13

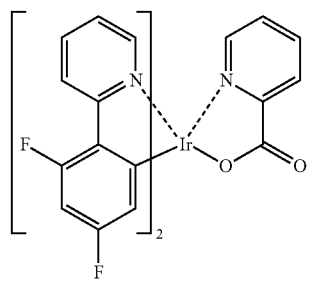

Compound 14

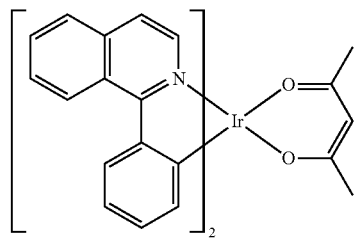

PtOEP

Ir(piq)$_3$

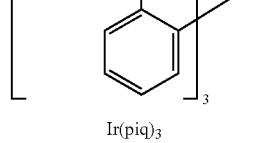

Btp$_2$Ir(acac)

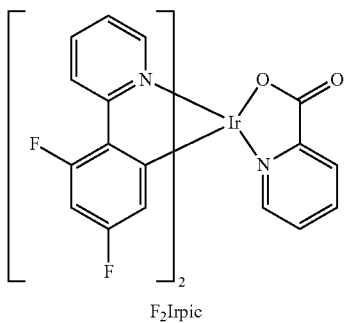

F₂Irpic

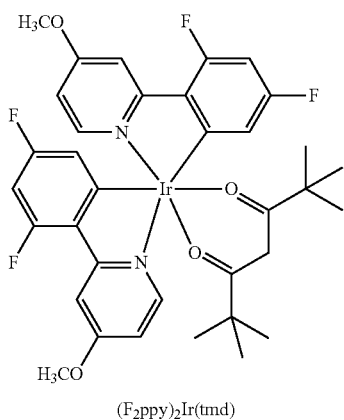

(F₂ppy)₂Ir(tmd)

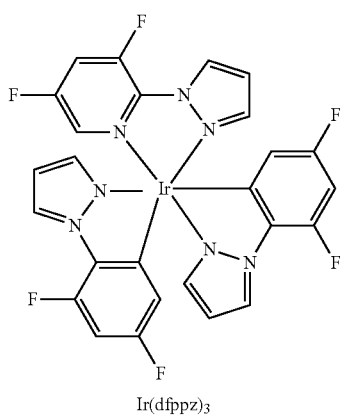

Ir(dfppz)₃

In addition to the first layer that may function as an emission layer as described above, the OLED may further include at least one layer selected from a hole injection layer ("HIL"), a hole transport layer ("HTL"), a hole blocking layer ("HBL"), an electron transport layer ("ETL"), and an electron injection layer ("EL") between a first electrode and a second electrode.

FIG. 1 is a schematic sectional view of an OLED 10 according to a representative embodiment of the present invention. Referring to FIG. 1, the OLED 10 includes a substrate 11, a first electrode 12, a HTL 13, a first layer 15, an ETL 16, an EIL 18, and a second electrode 19. The first layer 15 may function as an emission layer ("EML"). Hereinafter, the OLED 10 and a representative method of manufacturing the same will be described in detail.

First, the first electrode 12 is formed on the substrate 10 by deposition, ion plating, plating, or sputtering. The substrate 10 may be any substrate that is used in general organic light-emitting devices, such as a glass substrate or a transparent plastic substrate with excellent mechanical strength, thermal stability, transparency, surface smoothness, ease of handling, and waterproofness. The first electrode 12 may be formed of a first electrode-forming material having a high work function, and may constitute an anode that may inject holes or a cathode that may inject electrons. Representative first electrode-forming materials include a metal oxide, a metal sulfide, and a metal, all of which have a high electrical conductivity. In general, these materials are used to form a thin film. Examples of the first electrode-forming material include indium oxide, zinc oxide, tin oxide, a combination thereof such as indium tin oxide ("ITO") or indium zinc oxide ("IZO"), gold (Au), platinum (Pt), silver (Ag) and copper (Cu). Furthermore, polyaniline or a derivative thereof, or polythiophene or a derivative thereof may be used as the first electrode-forming material. The first electrode may have a monolayered structure or a multilayered structure including at least two layers. In certain embodiments, the first electrode 12 may contain at least two different materials. The thickness of the first electrode may be varied to achieve an intended light transmittance and electrical conductivity, and in certain embodiments ranges from about 10 nm to about 10 μm.

Next, although not illustrated in FIG. 1, if the first electrode 12 is an anode, a HIL may be further formed on the first electrode 12. The HIL may be formed by vacuum deposition, spin coating, casting, inkjet printing, Langmuir-Blodgett ("LB") deposition, or the like.

If the HIL is formed using vacuum deposition, the deposition conditions may vary according to the material that is used to form the HIL, and the structure and thermal properties of the HIL to be formed. In general, however, conditions for vacuum deposition may include a deposition temperature ranging from about 100° C. to about 500° C., a pressure ranging from about $10^{-8}$ to about $10^{-3}$ torr, and a deposition rate ranging from about 0.01 to about 100 Å/sec.

When the HIL is formed by spin coating, coating conditions may vary according to the compound(s) used to form the HIL, and the desired structure and thermal properties of the HIL to be formed. In general, however, the coating speed may be in the range of about 2000 rpm to about 5000 rpm, and a temperature for heat treatment, which is performed to remove a solvent after coating, may be in the range of about 80° C. to about 300° C.

The HIL may be formed of any material that is commonly used to form a HIL. Representative examples of the material that may be used to form the HIL include a phthalocyanine compound such as copper phthalocyanine, 4,4',4"-tris[(3-methylphenyl)phenylamino]triphenylamine ("m-MTDATA"), N,N'-di(1-naphthyl)-N,N'-diphenylbenzidine ("NPB"), TDATA (see the indicated formula below), and 2T-NATA (see the indicated formula below).

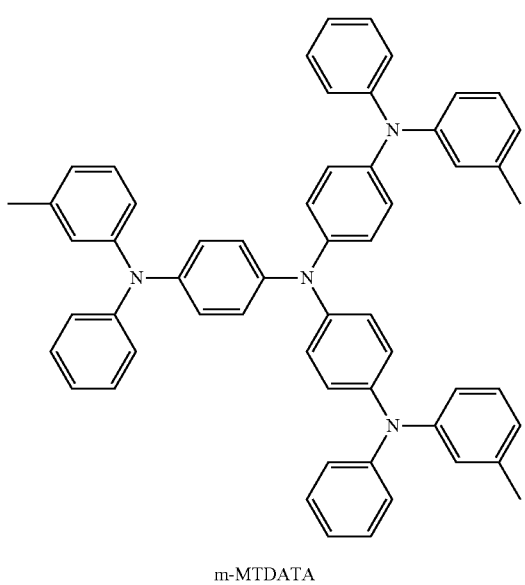

m-MTDATA

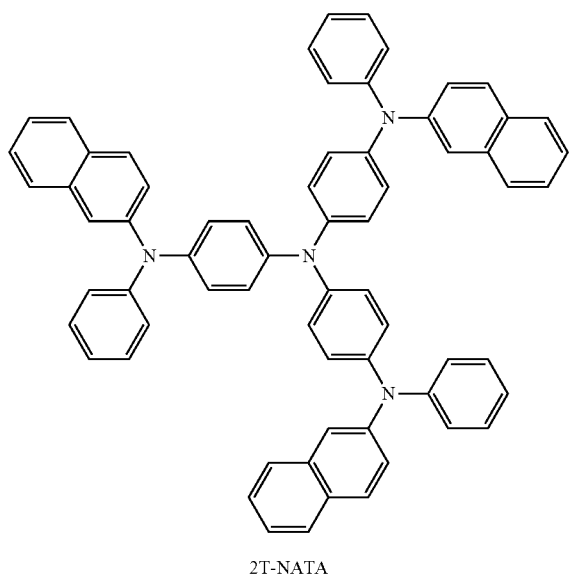

2T-NATA

In certain embodiments, the thickness of the HIL may be about 100 to about 10000 Å, for example, 100 to about 1000 Å. When the thickness of the HIL is within the above range, the HIL may have excellent hole injection properties without an increase in driving voltage.

Next, the HTL 13 may be formed on the first electrode or the HIL using a known method such as vacuum deposition, spin coating, casting, inkjet printing, or LB deposition.

When the HTL 13 is formed using vacuum deposition or spin coating, the conditions for deposition and coating are generally similar to those for the formation of the HIL, although the conditions for the deposition and coating may vary according to the material that is used to form the HTL.

The HTL 13 may be formed of any known material used to form a HTL. Representative examples of the material that can be used to form the HTL 13 include an amine derivative having an aromatic condensed ring, such as N,N'-bis(3-methylphenyl)-N,N'-diphenyl-[1,1-biphenyl]-4,4'-diamine ("TPD," see the indicated formula below), or N,N'-di(naphthalene-1-yl)-N,N'-diphenylbenzidine ("NPD," see the indicated formula below); polyaniline/dodecylbenzenesulfonic acid ("Pani/DBSA," see the indicated formula below); poly (3,4-ethylenedioxythiophene)/poly(4-styrenesulfonate) ("PEDOT/PSS," see the indicated formula below); polyaniline/camphor sulfonic acid ("Pani/CSA"); and polyaniline/poly(4-styrenesulfonate (PANI/PSS).

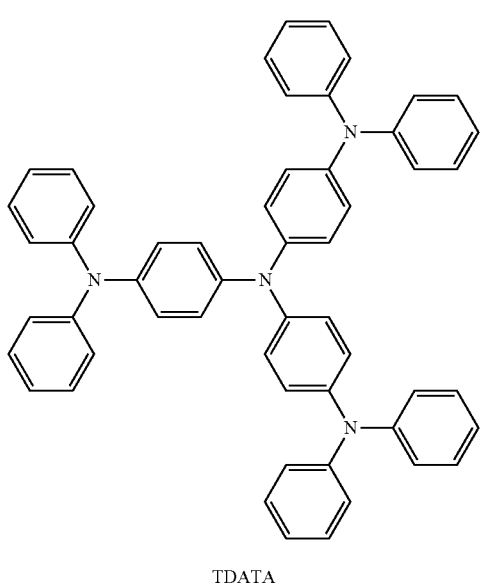

TDATA

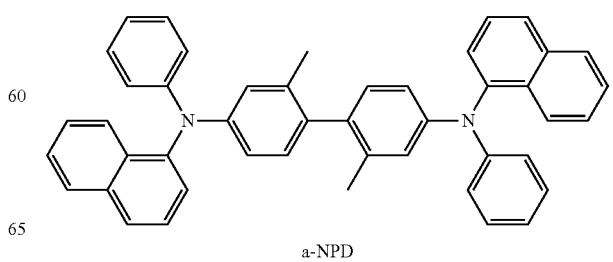

a-NPD

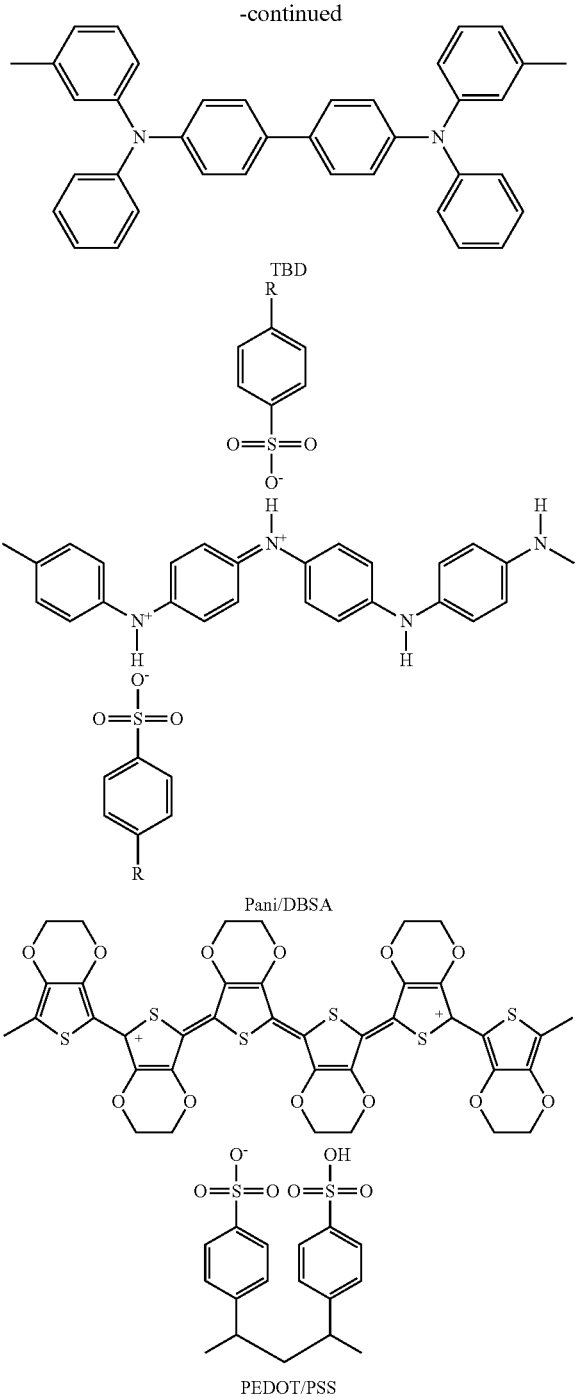

TBD

Pani/DBSA

PEDOT/PSS

In certain embodiments, the thickness of the HTL 13 may be in the range of about 50 Å to about 1,000 Å, for example, about 100 Å to about 600 Å. When the thickness of the HTL 13 is within the above range, the HTL 13 may have excellent hole transport properties without a substantial increase in driving voltage.

The first layer 15, which may function as an EML, may be formed on the hole transport layer 13. The first layer 15 may be formed by spin coating, casting, inkjet printing, LB deposition, or the like. When the first layer 15 is formed using spin coating, the conditions for forming the first layer 15 are generally similar to those for the formation of the HIL, although the conditions for forming the first layer 15 may vary according to the material that is used to form the first layer 15.

The first layer 15 may include the polymer comprising the polymeric unit of Formula 1 above as a host. Alternatively, or in addition, the first layer 15 may further include a phosphorescent dopant, in addition to the polymer comprising the polymeric unit of Formula 1. Examples of the phosphorescent dopant are provided above.

If the first layer 15 includes the polymer comprising the polymeric unit of Formula 1 and a phosphorescent dopant, the amount of the phosphorescent dopant may be in the range of about 1 wt % to about 10 wt %. When the amount of the phosphorescent dopant is within the above range, concentration quenching may be substantially prevented.

The first layer 15 may exclusively include the polymer comprising the polymeric unit of Formula 1 above. Alternatively, the first layer 15 may further include one or more additional materials, such as a known fluorescent dopant, in addition to the polymer comprising the polymeric unit of Formula 1.

In certain embodiments, the thickness of the first layer 15, which may function as an EML, may be in the range of about 100 to about 1,000 Å, for example, about 200 to about 900 Å. When the thickness of the first layer 15 is within the above range, the first layer 15 may have excellent light emission characteristics without a substantial increase in driving voltage.

A HBL may further be formed on the first layer 15, if desired, although not illustrated in FIG. 1.

The HBL may prevent triplet excitons or holes in the first layer 15 from diffusing into the second electrode 19. The HBL may be formed using vacuum deposition, spin coating, casting, LB deposition, or the like. When the HBL is formed using vacuum deposition or spin coating, the deposition and coating conditions may be generally similar to whose for the formation of the HIL, although the conditions for deposition and coating may vary according to the material that is used to form the HBL. Representative examples of the material that may be used to form the HBL include an oxadiazole derivative, a triazole derivative, a phenanthroline derivative, and TAZ (see the formula below).

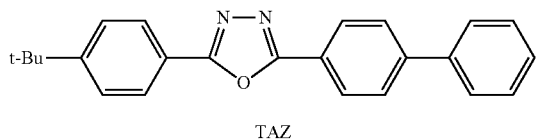 [SMILES: CC(C)(C)c1ccc(-c2nnc(-c3ccc(-c4ccccc4)cc3)o2)cc1]

TAZ

In certain embodiments, the thickness of the HBL may be about 50 to about 1000 Å, for example, about 100 to about 300 Å. When the thickness of the HBL is within the above range, the HBL may have excellent hole blocking properties.

Next, the ETL 16 may be formed on the HBL or EML using vacuum deposition, spin coating, casting, or the like. When the ETL is formed using vacuum deposition or spin coating, the deposition and coating conditions may be generally similar to those for the formation of the HIL, although the deposition and coating conditions may vary according to the material that is used to form the ETL. The material that may be used to form the ETL may include any known material that stably transports electrons injected from an electron injection electrode, that is, a cathode, such as a quinoline derivative, 4,7-diphenyl-1,10-phenanthroline ("Bphen"), BAlq (see the formula below), tris(8-quinolinorate)aluminum ("Alq$_3$"), beryllium bis(benzoquinolin-10-olate ("Bebq$_2$"), or TPBi (see the formula below).

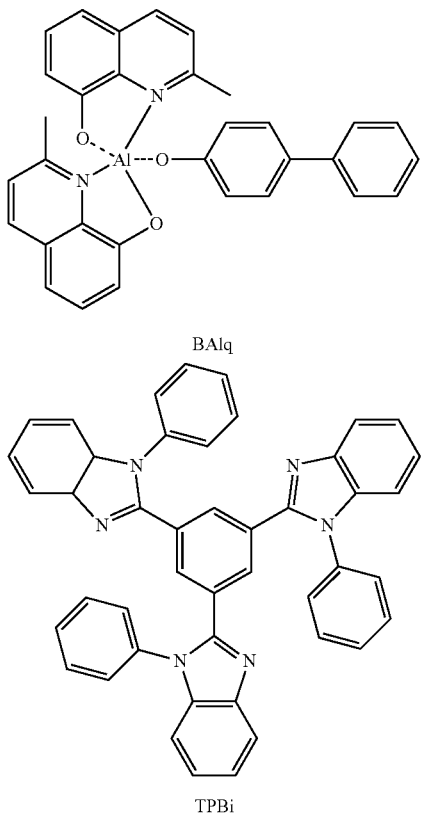

BAlq

TPBi

The thickness of the ETL 16 may be in the range of about 100 to about 1,000 Å, for example, about 200 to about 500 Å. When the thickness of the ETL 16 is within the above range, the HTL may have satisfactory electron transport properties without a substantial decrease in driving voltage.

Next, the EIL 18 may be formed on the ETL 16 or the first layer 15. The EIL 18 may be formed of any known material, such as LiF, NaCl, CsF, Li$_2$O, BaO, BaF$_2$, or the like. The deposition and coating conditions for the EIL 18 may be generally similar to those for the formation of the HIL, although the deposition and coating conditions may vary according to the material that is used to form the EIL 18.

In certain embodiments, the thickness of the EIL 18 may be in the range of about 1 to about 100 Å, for example, about 5 to about 50 Å. When the thickness of the EIL 18 is within the above range, the EIL 18 may have excellent electron injection properties without an increase in driving voltage.

Finally, the second electrode 19 may be formed on the EIL 19. The second electrode 19 may be formed according to the method described above in conjunction with the first electrode 12. The second electrode 19 may constitute a cathode or an anode. When the second electrode 19 constitutes a cathode, the second electrode 19 may be formed of a material having a low work function. Examples of the material having a low work function include an alkali metal, such as lithium (Li), sodium (Na), potassium (K), rubidium (Rb), or cesium (Cs); an alkali earth metal, such as beryllium (Be), magnesium (Mg), calcium (Ca), strontium (Sr), or barium (Ba); a metal, such as aluminum (Al), scandium (Sc), vanadium (V), zinc (Zn), yttrium (Y), indium (In), cerium (Ce), samarium (Sm), europium (Eu), terbium (Tb), or ytterbium (Yb); an alloy of at least two of these metals; an alloy of at least one of these metals with gold (Au), silver (Ag), platinum (Pt), copper (Cu), manganese (Mg), titanium (Ti), cobalt (Co), nickel (Ni), tungsten (W), tin (Sn); graphite; and graphite intercalation compound, but are not limited thereto. Representative examples of alloys that may be used to form the second electrode 19 include a Mg—Ag alloy, a Mg—In alloy, a Mg—Al alloy, an In—Ag alloy, a Li—Al alloy, a Li—Mg alloy, a Li—In alloy, and a Ca—Al alloy. The second electrode 19 may be formed as a monolayer or a multilayer including at least two layers. The second electrode 19 may exclusively contain one material or may include two different materials. The second electrode 19 may be implemented in various forms, for example, as a transparent, semitransparent or reflective electrode. In certain embodiments, the thickness of the second electrode 19 may be in the range of, for example, about 10 nm to about 10 μm.

EXAMPLES

Synthesis Example 1

Synthesis of Compound 1

Compound 1 was synthesized through Reaction Scheme 1 below:

Reaction Scheme 1

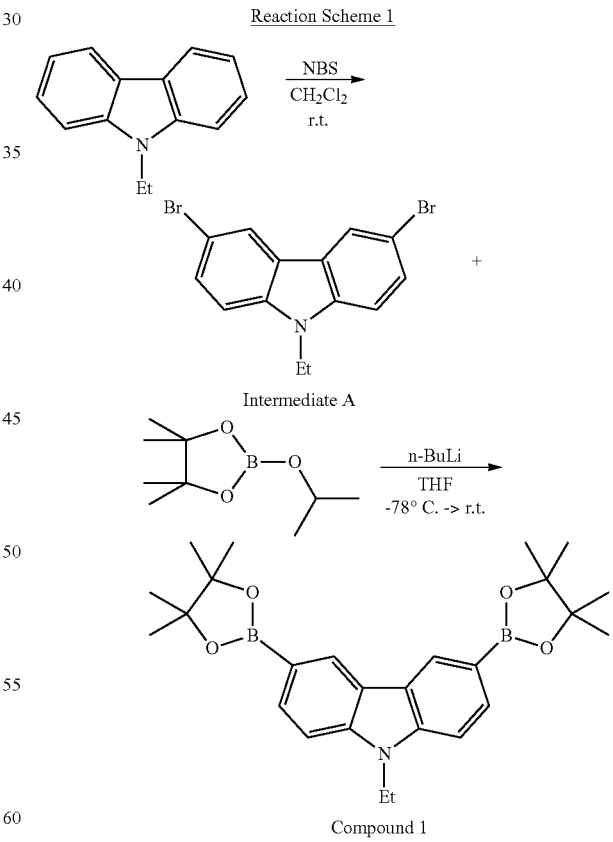

Compound 1

Synthesis of Intermediate A

A mixture of 20.13 g (100.0 mmol) of 9-ethylcarbazole, 3.738 g (210.0 mmol) of N-bromosuccinimide ("NBS"), and 100 ml of CH$_2$Cl$_2$ was stirred at room temperature (about 25° C.) to obtain 53.54 g of Intermediate A with a yield of 98%.

¹H-NMR (300 MHz, CDCl₃): δ=8.121 (s, 2H), 7.568 (d, 2H), 7.281 (d, 2H), 4.319 (q, 2H), 1.419 (t, 3H)

¹³C-NMR (75 MHz, CDCl₃): δ=138.8, 129.0, 123.5, 123.2, 111.9, 110.1, 37.81, 13.69

Synthesis of Compound 1

2.758 g (10.00 mmol) of Intermediate A was mixed with 20 ml of tetrahydrofuran ("THF") in a −76° C., dry ice bath, and 15.6 ml (25.00 mmol) of n-BuLi (1.6 M in hexane) was added thereto. The mixture was stirred at −78° C. for 2 hours, and a mixture of 6.3 ml (30 mmol) of 2-isopropoxy-4,4,5,5-tetramethyl-1.3.2-dioxaborolane with 10 ml of THF was further added. Then, the temperature was raised to room temperature (about 25° C.), and the mixture was stirred to obtain 2.50 g of Compound 1 with a yield of 56%.

¹H-NMR (300 MHz, CDCl₃): δ=8.700 (s, 2H), 7.957 (d, 2H), 7.439 (d, 2H), 4.435 (q, 2H), 1.477 (t, 3H), 1.418 (s, 24H)

¹³C-NMR (75 MHz, CDCl₃): δ=142.1, 132.0, 128.1, 122.9, 107.8, 83.5, 37.6, 24.9, 13.7

Synthesis Example 2

Synthesis of Compound 2

Compound 2 was synthesized through Reaction Scheme 2 below:

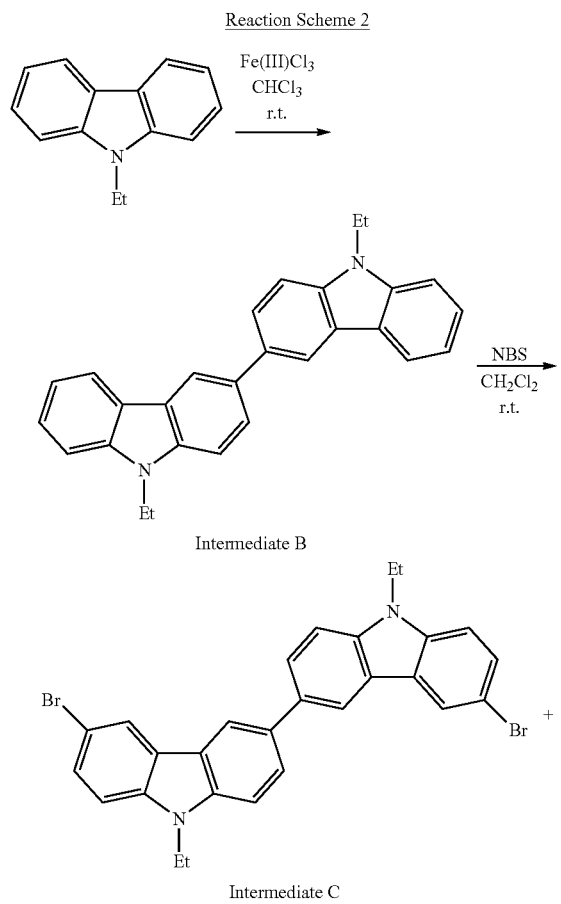

Reaction Scheme 2

Intermediate B

Intermediate C

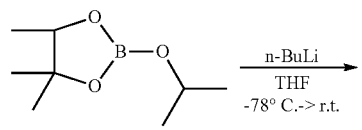

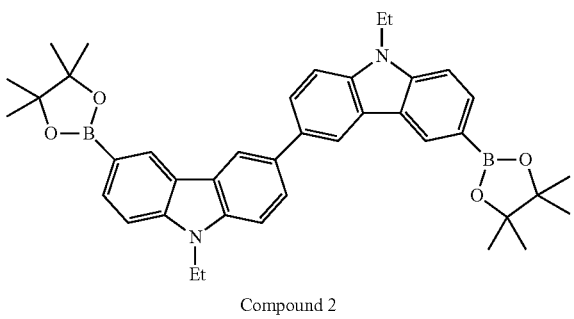

Compound 2

Synthesis of Intermediate B

A mixture of 20.13 g (100.0 mmol) of 9-ethylcarbazole, 13.06 g (210.0 mmol) of Fe(III)Cl₃, and 20 ml of CHCl₃ was stirred at room temperature and the product was purified to obtain 34.97 g of Intermediate B with a yield of 90%.

¹H-NMR (300 MHz, CDCl₃): δ=8.443 (s, 2H), 8.234 (d, 2H), 7.882 (d, 2H), 7.549 (m, 6H), 7.307 (d, 2H), 4.487 (q, 4H), 1.535 (t, 6H)

¹³C-NMR (75 MHz, CDCl₃): δ=140.3, 139.0, 133.5, 125.7, 125.6, 123.5, 123.2, 120.6, 119.1, 118.8, 108.7, 108.6, 37.6, 14.0

Synthesis of Intermediate C 34.97 g (90.00 mmol) of Intermediate B, 40.05 g (225.0 mmol) of NBS and 90 ml of CH₂Cl₂ were mixed at room temperature and the product was purified to obtain 48.18 g of Intermediate C with a yield of 98%.

¹H-NMR (300 MHz, CDCl₃): δ=8.335 (d, 4H), 7.854 (d, 2H), 7.583 (d, 2H), 7.492 (d, 2H), 7.280 (d, 2H), 4.389 (q, 4H), 1.480 (t, 6H)

¹³C-NMR (75 MHz, CDCl₃): δ=139.3, 138.9, 133.4, 128.3, 126.1, 124.8, 123.2, 122.5, 119.0, 111.6, 110.0, 109.0, 37.7, 13.8

Synthesis of Compound 2

5.462 g (10.00 mmol) of Intermediate C was mixed with 20 ml of THF in a −78° C., dry ice bath, and 15.6 ml (25.00 mmol) of n-BuLi (1.6 M in hexane) was added thereto. The mixture was stirred at −78° C. for 2 hours, and a mixture of 6.3 ml (30 mmol) of 2-isopropoxy-4,4,5,5-tetramethyl-1.3.2-dioxaborolane with 10 ml of THF was further added. Then, the temperature was raised to room temperature (about 25° C.), and the mixture was stirred to obtain 2.95 g of Compound 2 with a yield of 46%.

¹H-NMR (300 MHz, CDCl₃): δ=8.74 (s, 2H), 8.53 (s, 2H), 7.99 (d, 2H), 7.89 (d, 2H), 7.54 (d, 2H), 7.47 (d, 2H), 4.48 (q, 4H), 1.53 (t, 6H), 1.45 (s, 24H)

Synthesis Example 3

Synthesis of Compound 3

Compound 3 was synthesized through Reaction Scheme 3 below:

Reaction Scheme 3

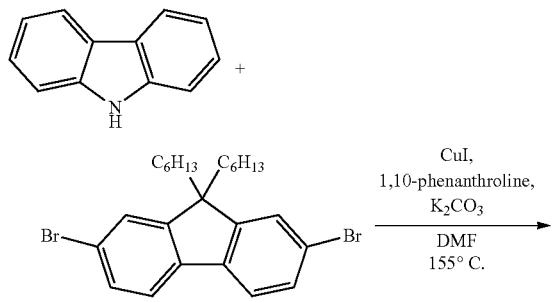

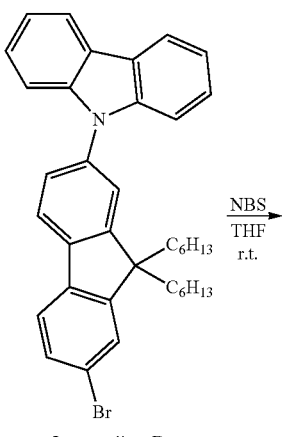

Intermediate D

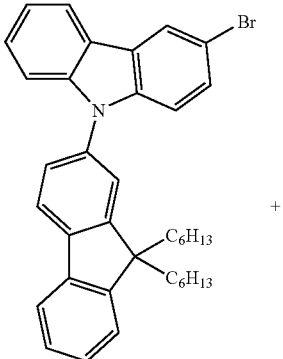

Intermediate E

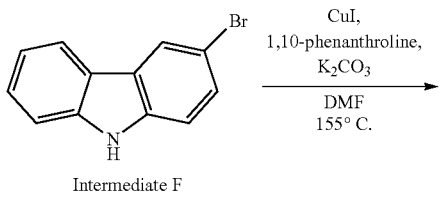

Intermediate F

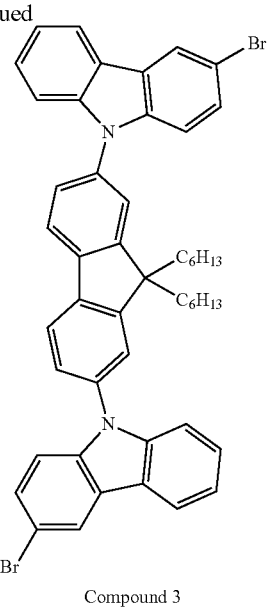

Compound 3

Synthesis of Intermediate D

A mixture of 17.06 g (100 mmol) of carbazole, 50.75 g (100.0 mmol) of 2.7-dibromo-9,9-dihexyl-9H-fluorene, 1.904 g (10 mmol) of CuI, 5.460 g (30.00 mmol) of 1,10-phenanthroline, 23.46 g (170.0 mmol) of $K_2CO_3$, and 100 ml of dimethylformamide (DMF) was stirred at 155° C. for 12 hours to obtain 40.50 g of Intermediate D with a yield of 70%.

$^1$H-NMR (300 MHz, $CDCl_3$): δ=8.235 (d, 2H), 7.933 (d, 1H), 7.690 (m, 4H), 7.487 (d, 4H), 7.387 (m, 2H), 2.063 (m, 4H), 1.558 (m, 12H), 1.203 (m, 10H)

$^{13}$C-NMR (75 MHz, $CDCl_3$): δ=153.2, 152.2, 141.0, 139.3, 136.8, 130.2, 126.3, 125.9, 123.4, 121.8, 121.5, 121.2, 120.9, 120.4, 119.9, 109.7, 55.7, 40.2, 31.5, 29.6, 23.8, 22.5, 14.0

Synthesis of Intermediate E

A mixture of 40.50 g (69.99 mmol) of Intermediate D, 10.85 g (6.499 mmol) NBS, 100 ml of $CH_2Cl_2$ was stirred at room temperature (about 25° C.) to obtain 36.82 g of Compound 5 with a yield of 80%.

$^1$H-NMR (300 MHz, $CDCl_3$): δ=8.344 (s, 1H), 8.127 (d, 1H), 7.665 (d, 1H), 7.558 (d, 1H), 7.505 (m, 7H), 7.287 (m, 2H), 2.063 (m, 4H), 1.195 (m, 12H), 0.872 (m, 10H)

$^{13}$C-NMR (75 MHz, $CDCl_3$): δ=153.9, 142.7, 141.1, 139.5, 136.3, 130.8, 126.3, 125.7, 123.5, 121.8, 121.5, 121.3, 120.4, 120.9, 119.8, 109.6, 55.5, 40.3, 31.3, 29.1, 23.8, 22.8, 14.5

Synthesis of Compound 3

A mixture of 6.575 g (10.00 mmol) of Intermediate E, 2.461 g (10.00 mmol) of Intermediate F, 190 mg (1.00 mmol) of CuI, 546 mg (3.00 mmol) of 1,10-phenanthroline, 2.346 g (17.0 mmol) of $K_2CO_3$, and 20 ml of DMF was stirred at 155° C. for 12 hours to obtain 4.607 g of Intermediate D with a yield of 56%.

$^1$H-NMR (300 MHz, $CDCl_3$): δ=8.536-7.282 (m, 20H), 2.320 (m, 4H), 1.191 (m, 12H), 0.627 (m, 10H)

The intermediate F was synthesized through Reaction Scheme 3A below as follows: 8.708 g (50.00 mmol) of carbazole, 8.899 g (50.00 mmol) of NBS and 100 ml of THF were stirred at room temperature (about 25° C.) to obtain 11.70 g of Intermediate F with a yield of 95%.

$^1$H-NMR (300 MHz, $CDCl_3$): δ=11.701 (br, 1H), 8.205 (d, 1H), 8.015 (s, 1H), 7.504-7.201 (m, 5H)

$^{13}$C-NMR (75 MHz, CDCl$_3$): δ=135.4, 131.4, 124.0, 122.2, 121.1, 121.0, 120.1, 118.9, 113.3, 111.1

Formula 3A

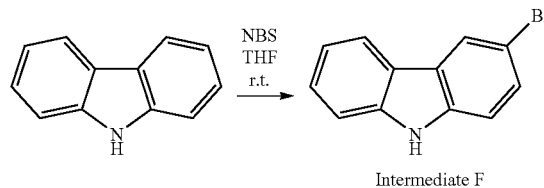

Intermediate F

Synthesis Example 4

Synthesis of Polymer 1

Polymer 1 was synthesized through Reaction Scheme 4 below:

Reaction Scheme 4

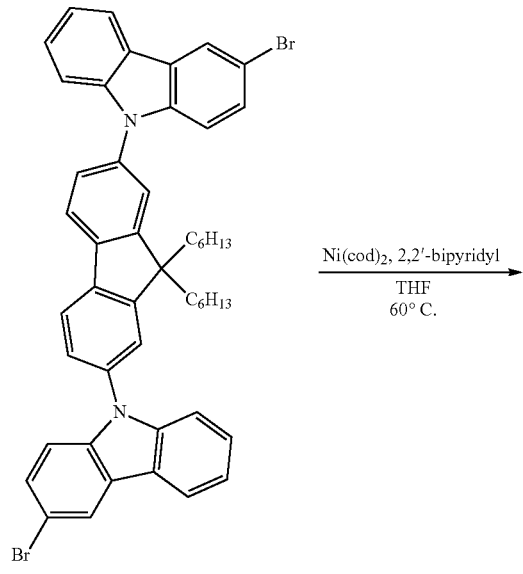

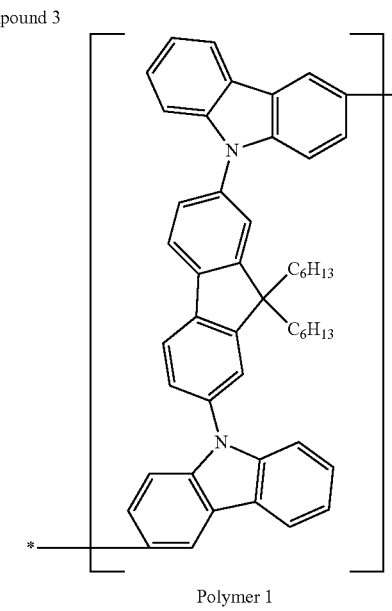

Polymer 1

A mixture of 222 mg (0.2703 mmol) of Compound 3 obtained in Synthesis Example 3, 186 mg (0.6758 mmol) of Ni(cod)$_2$ ("cod"=1,5-cyclooctadiene), 106 mg (0.6758 mmol) of 2,2'-bipyridyl, and 10 ml of THF was stirred at 60° C. to obtain 130 mg of Polymer 1.

$^1$H-NMR (300 MHz, CDCl$_3$): δ=8.527-7.192 (m, 20H), 2.318 (m, 4H), 1.201 (m, 12H), 0.637 (m, 10H)

Mw of Polymer 1 (weight average molecular weight)= 114440, PDI=2.31

Synthesis Example 5

Synthesis of Polymer 2

Polymer 2 was synthesized through Reaction Scheme 5 below:

Reaction Scheme 5

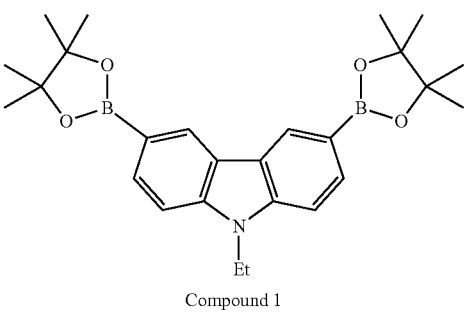

Compound 1

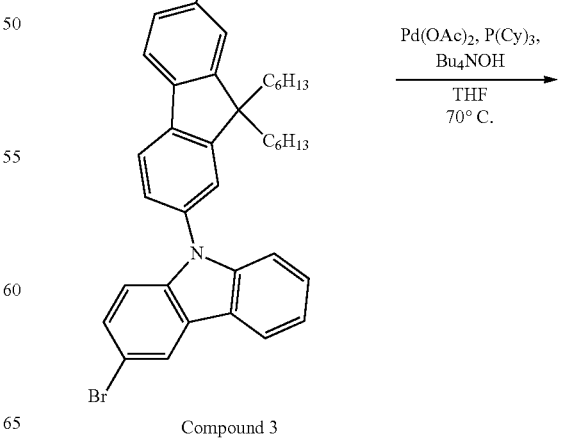

Compound 3

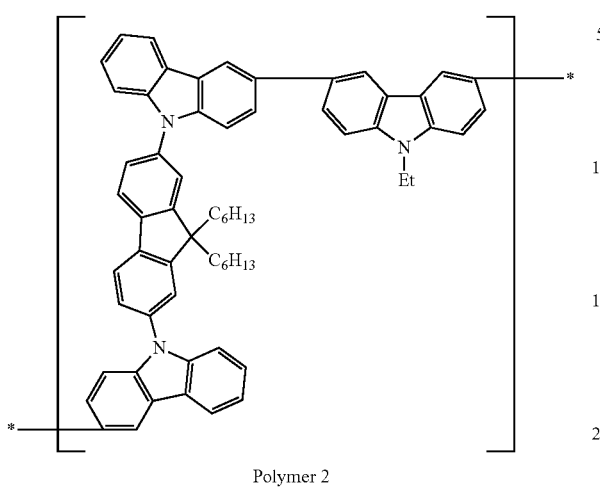

Polymer 2

A mixture of 94 mg (0.2093 mmol) of Compound 1 obtained in Synthesis Example 1, 172 mg (0.2093 mmol) of Compound 3 obtained in Synthesis Example 3, 10 mg (0.04186 mmol) of palladium (II) acetate (Pd(OAc)₂), 24 g (0.08372 mmol) of tricyclohexylphosphine (P(Cy)₃), 1.8 ml (1.8318 mmol) of tetra-n-butylammonium hydroxide (Bu₄NOH), and 20 ml of toluene was stirred at 100° C. to obtain 182 mg of Polymer 2.

¹H-NMR (300 MHz, CDCl₃): δ=8.527-7.192 (m, 26H), 4.472 (q, 2H), 2.308 (m, 4H), 1.674 (t, 3H), 1.201 (m, 12H), 0.637 (m, 10H)

Mw of Polymer 2 (weight average molecular weight)= 49580, PDI=2.51

Synthesis Example 6

Synthesis of Polymer 3

Polymer 3 was synthesized through Reaction Scheme 6 below:

Reaction Scheme 6

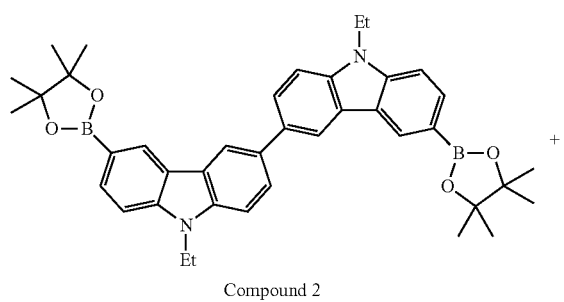

Compound 2

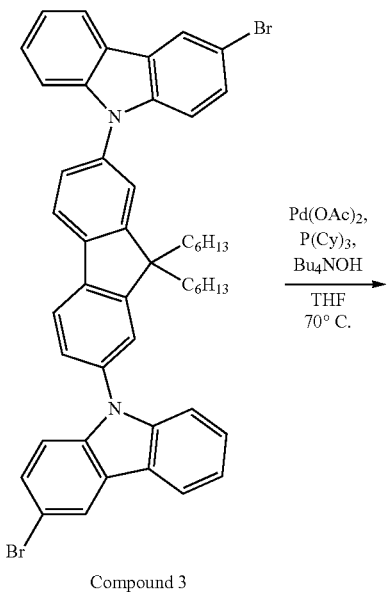

Compound 3

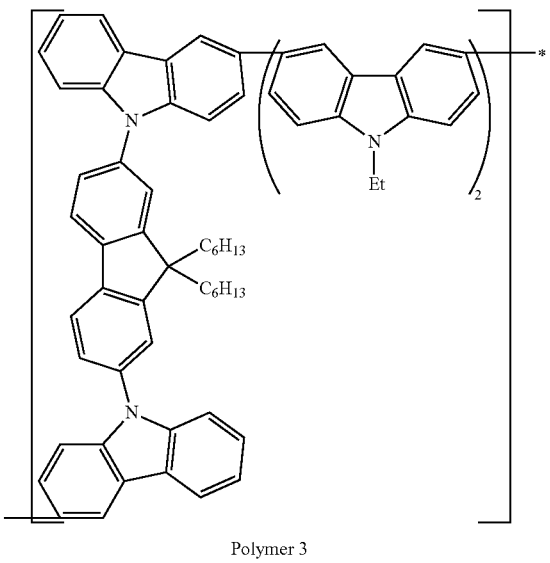

Polymer 3

127 mg of Polymer 3 was obtained in the same manner as in Synthesis Example 5, except that 137 mg (0.2137 mmol) of Compound 2 obtained in Synthesis Example 2, 175.8 mg (0.2137 mmol) of Compound 3 obtained in Synthesis Example 3 were used.

¹H-NMR (300 MHz, CDCl₃): δ=8.527-7.192 (m, 32H), 4.494 (q, 4H), 2.308 (m, 4H), 1.695 (t, 6H), 1.201 (m, 12H), 0.637 (m, 10H)

Mw of Polymer 3 (weight average molecular weight)= 57300, PDI=2.33

Evaluation Example 1

Evaluation of Light-Emitting Properties of Polymers (in Solution)

Light-emitting properties of Polymers 1, 2 and 3 were evaluated using UV absorption and photoluminescence ("PL") spectra thereof. Initially, Polymer 1 was diluted in toluene to a concentration of 0.2 mM, and then the UV absorption spectrum thereof was measured using a Shimadzu UV-350 Spectrometer. The same process was repeated using Polymer 3. The results are shown in Table 2.

Separately, Polymer 1 was diluted in toluene to a concentration of 10 mM, and the PL spectrum thereof was measured using an ISC PC1 Spectrofluorometer equipped with a Xenon lamp. The same process was repeated using Polymer 3. The results are shown in FIG. 3.

Figure 2:
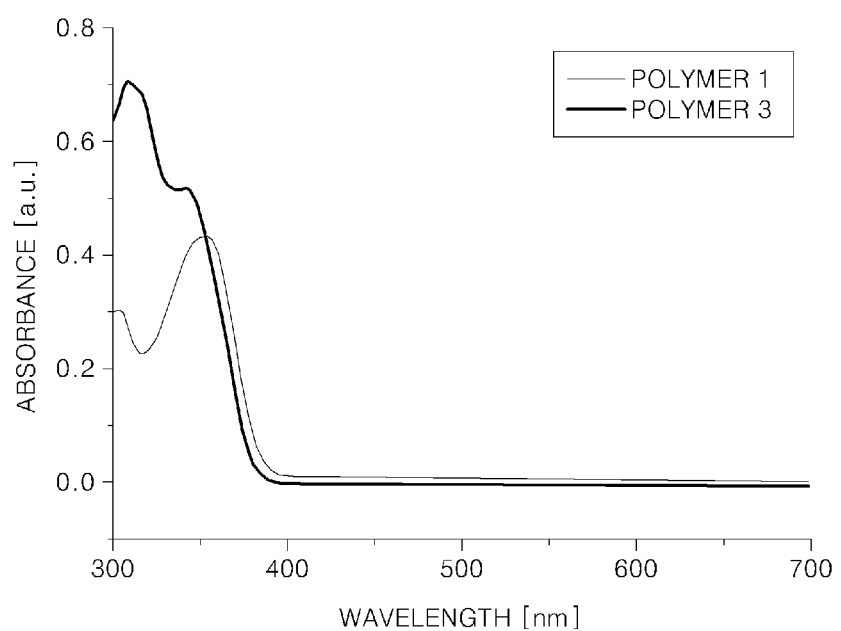
FIG. 2 is a graph illustrating UV spectra of solutions of representative Polymers 1 to 3 obtained according to Synthesis Examples 4 to 6, respectively.
Figure 3:
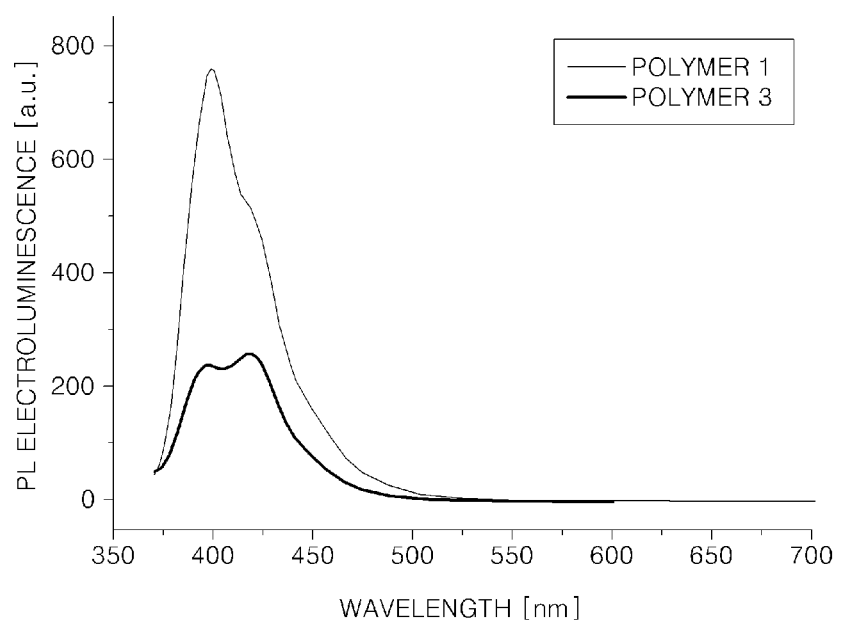
FIG. 3 is a graph illustrating photoluminescence ("PL") spectra of solutions of representative Polymers 1 to 3 obtained according to Synthesis Examples 4 to 6, respectively.

Referring to FIGS. 2 and 3, the solutions of Polymers 1 and 3 had excellent light-emitting properties. Referring to FIG. 3, a maximum PL wavelength of Polymer 1 was about 398 nm, and maximum PL wavelength of Polymer 3 was about 417 nm.

Example 1

First, a transparent electrode substrate formed by coating a glass substrate with indium-tin oxide ("ITO") was cleaned. Then, the ITO layer was patterned into a desired pattern using a photosensitive resin and an etchant, followed by cleaning. A HTL composition (Batron P 4083, available from Bayer AG) containing 3,4-ethylenedioxythiophene ("PEDOT") was coated on the ITO layer to a thickness of about 50 nm and baked at 200° C. for about 0.5 hours to form a HTL. An EML composition containing Polymer 1 and 5 wt % of $Ir(ppy)_3$ in chlorobenzene was spin-coated on the HTL and baked at 180° C. for 30 minutes to form an EML containing Polymer 1 and $Ir(ppy)_3$ (5 wt %). The HTL composition and the EML composition were filtered using a 0.2 mm filter prior to the coating. The concentrations and coating rates of the HTL composition and the EML composition were adjusted to form a HTL having a thickness of 50 nm and an EML having a thickness of 25 nm. TPBi was vacuum-deposited on the EML at a pressure of $4 \times 10^{-6}$ torr or less to form an ETL having a thickness of 40 nm. Then, LiF and Al were sequentially deposited on the ETL to form an EIL having a thickness of 1 nm and a second electrode having a thickness of 100 nm, thereby manufacturing an OLED. The thickness and growth rate of each of the layers were adjusted using a crystal sensor during the deposition process.

Example 2

An OLED was manufactured in the same manner as in Example 1, except that Polymer 3, instead of Polymer 1, was used to form the EML.

Comparative Example 1

An OLED was manufactured in the same manner as in Example 1, except that 4,4'-N,N'-dicarbazole-biphenyl ("CBP"), instead of Polymer 1, was used to form the EML.

Evaluation Example 2

Electroluminescence, current density, luminance, and efficiency of each of the OLEDS of Examples 1 and 2 and Comparative Example 1 were evaluated using a PR650 Spectroscan Source Measurement Unit (available from PhotoResearch).

The structures and performances of the OLEDs of Examples 1 and 2 and Comparative Example 1 are summarized in Table 1 below:

TABLE 1

| No. | anode | HTL | EML | ETL | EIL/cathode | Efficiency [cd/A] |
|---|---|---|---|---|---|---|
| Example 1 | ITO (150) nm | PEDOT:PSS (50 nm) | Polymer 1:Ir(ppy)$_3$ (5 wt %) | TPBi (40 nm) | LiF (1 nm)/ Al (100 nm) | 15.1 (6.0 V) |
| Example 2 | ITO (150) nm | PEDOT:PSS (50 nm) | Polymer 3:Ir(ppy)$_3$ (5 wt %) | TPBi (40 nm) | LiF (1 nm)/ Al (100 nm) | 26.0 (6.2 V) |
| Comparative Example 1 | ITO (150) nm | PEDOT:PSS (50 nm) | CBP:Ir(ppy)$_3$ (5 wt %) | TPBi (40 nm) | LiF (1 nm)/ Al (100 nm) | 25.0 (6.0 V) |

Figure 4:
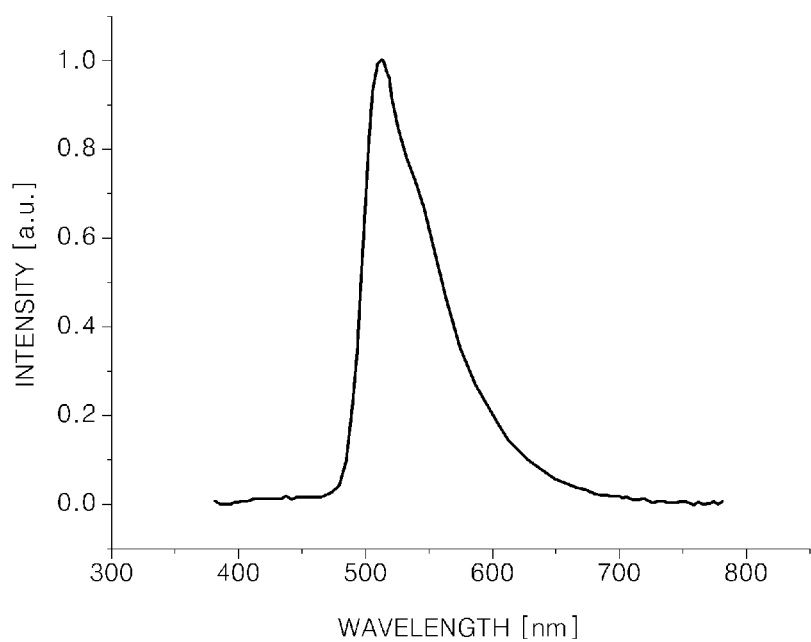
FIG. 4 is a graph of electroluminescence intensity of the representative organic light-emitting device ("OLED") of Example 1 with respect to wavelength.
Figure 5:
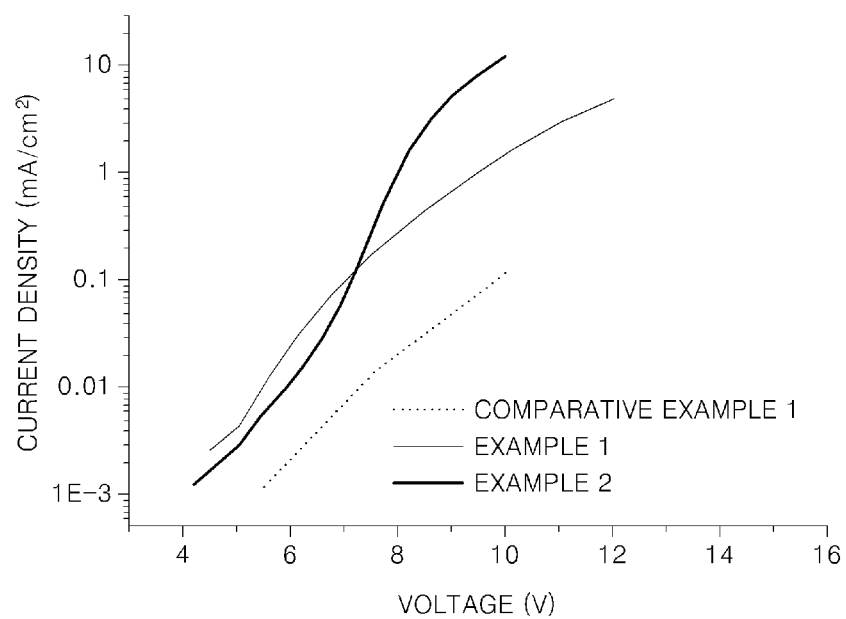
FIG. 5 is a graph of current densities (mA/cm$^2$) of the representative OLEDs of Examples 1 and 2 and Comparative Example 1 with respect to voltage.
Figure 6:
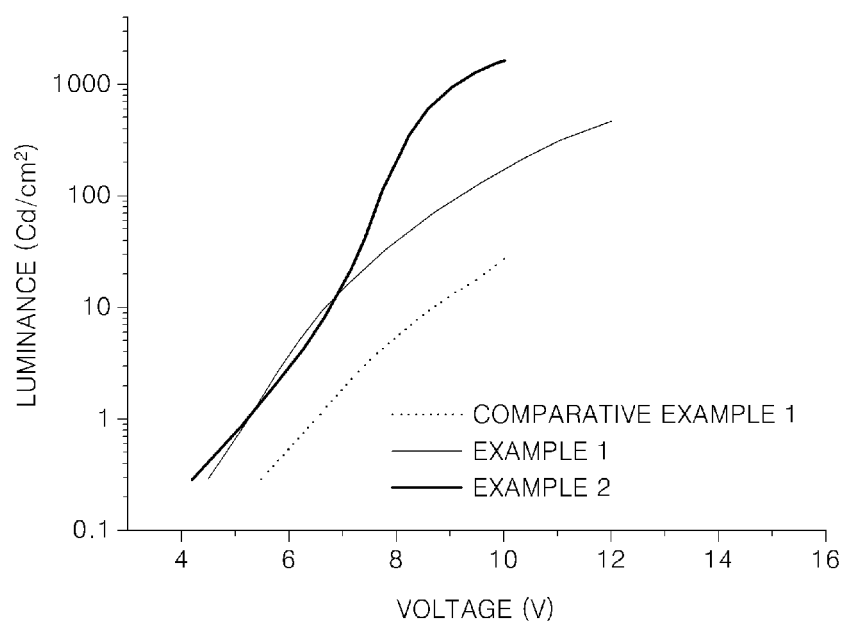
FIG. 6 is a graph of luminances (cd/cm$^2$) of the representative OLEDs of Examples 1 and 2 and Comparative Example 1 with respect to voltage.

FIG. 4 is a graph of electroluminescence intensity of the OLED of Example 1 with respect to wavelength. In addition, it was confirmed that since $Ir(ppy)_3$ was used in the OLEDs of Example 2 and Comparative Example 1 as a dopant used in the EML, electroluminescence intensities of the OLEDs of Example 2 and Comparative Example 1 with respect to wavelength were the same as illustrated in FIG. 4. FIG. 5 is a graph of current densities of the OLEDs of Examples 1 and 2 and Comparative Example 1 with respect to voltage. FIG. 6 is a graph of luminances of the OLEDs of Examples 1 and 2 and Comparative Example 1 with respect to voltage.

Referring to Table 1, the OLED of Example 1 has an efficiency of 15.1 cd/A at a driving voltage of 6.0 V, the OLED of Example 2 has an efficiency of 26.0 cd/A at a driving voltage of 6.2 V, and the OLED of Comparative Example 1 has an efficiency of 25.0 cd/A at a driving voltage of 6.0 V. From the efficiencies shown in Table 1, it is confirmed that Polymers 1 and 3 act as a phosphorescent host with respect to a green phosphorescent dopant, thereby efficiently transferring energy.

CBP used in the EML of the OLED of Comparative Example 1 is one of well-known phosphorescent host materials that act as a host with respect to green phosphorescent dopants. Referring to the voltage-current density graph of FIG. 5, it is confirmed that Polymers 1 and 3 used in the EML of the OLEDs of Examples 1 and 2 have higher charge transfer rates than that of CBP used in the EML of the OLED of Comparative Example 1. In addition, referring to the voltage-luminance graph of FIG. 6, it is confirmed that the OLED of Example 1 including Polymer 1 and the OLED of Example 2 including Polymer 3 have higher luminance than that of the OLED of Comparative Example 1.

Referring to FIGS. 5 to 6, it is confirmed that the OLEDs of Examples 1 and 2 have excellent electrical characteristics.

As described above, according to the one or more of the above embodiments of the present invention, the polymer comprising the polymeric unit of Formula 1 above may transport both holes and electrons and have a high triplet state energy level. Therefore, an OLED including the polymer comprising the polymeric unit of Formula 1 may have a high efficiency, a high current density, and a high luminance.

It should be understood that the exemplary embodiments described therein should be considered in a descriptive sense only and not for purposes of limitation. It should be understood that this disclosure is not limited to the disclosed embodiments, but, on the contrary, is intended to cover various modifications and equivalent arrangements included within the spirit and scope of the appended claims.

What is claimed is:

1. A polymer comprising a polymeric unit represented by Formula 1 below:

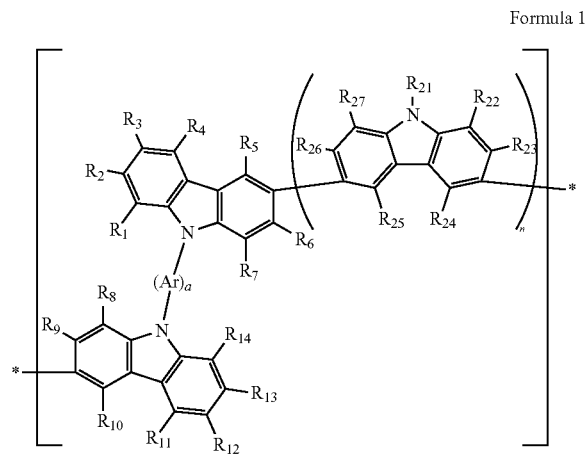

Formula 1 wherein each Ar is independently selected from a substituted or unsubstituted $C_6$-$C_{30}$ arylene group and a substituted or unsubstituted $C_3$-$C_{30}$ heteroarylene group;

a is an integer ranging from 1 to about 3;

each of $R_1$ to $R_{14}$ and $R_{21}$ to $R_{27}$ is independently selected from a hydrogen atom, a halogen atom, a hydroxyl group, an amino group, a cyano group, a carboxylic acid group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_6$-$C_{30}$ aryl group, a substituted or unsubstituted $C_3$-$C_{30}$ heteroaryl group, a group represented by —N($Q_1$)($Q_2$), and a group represented by —Si($Q_3$)($Q_4$)($Q_5$), wherein each of $Q_1$ to $Q_5$ is independently selected from a hydrogen atom, a halogen atom, a hydroxyl group, an amino group, a cyano group, a carboxylic acid group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_6$-$C_{30}$ aryl group, and a substituted or unsubstituted $C_3$-$C_{30}$ heteroaryl group;

n is an integer ranging from 1 to about 5; and each "*" indicates a point of attachment to the same or a different polymeric unit represented by Formula 1.

2. The polymer of claim 1, wherein Ar is selected from a substituted or unsubstituted phenylene group, a substituted or unsubstituted pentalenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene group, a substituted or unsubstituted phenalenylene group, a substituted or unsubstituted phenanthrenylene group, a substituted or unsubstituted anthracenylene group, a substituted or unsubstituted fluoranthenylene group, a substituted or unsubstituted triphenylenylene group, a substituted or unsubstituted pyrenylenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentaphenylene group, a substituted or unsubstituted hexacenylene group, a substituted or unsubstituted pyrrolylene group, a substituted or unsubstituted pyrazolylene group, a substituted or unsubstituted imidazolylene group, a substituted or unsubstituted imidazolinylene group, a substituted or unsubstituted imidazopyridinylene group, a substituted or unsubstituted imidazopyrimidinylene group, a substituted or unsubstituted pyridinylene group, a substituted or unsubstituted pyrazinylene group, a substituted or unsubstituted pyrimidinylene group, a substituted or unsubstituted indolylene group, a substituted or unsubstituted purinylene group, a substituted or unsubstituted quinolinylene group, a substituted or unsubstituted phthalazinylene group, a substituted or unsubstituted indolizinylene group, a substituted or unsubstituted naphthyridinylene group, a substituted or unsubstituted quinazolinylene group, a substituted or unsubstituted cinnolinylene group, a substituted or unsubstituted indazolylene group, a substituted or unsubstituted carbazolylene group, a substituted or unsubstituted phenazinylene group, a substituted or unsubstituted phenanthridinylene group, a substituted or unsubstituted pyranylene group, a substituted or unsubstituted chromenylene group, a substituted or unsubstituted benzofuranylene group, a substituted or unsubstituted thiophenylene group, a substituted or unsubstituted benzothiophenylene group, a substituted or unsubstituted isothiazolylene group, a substituted or unsubstituted benzoimidazolylene group, and a substituted or unsubstituted isoxazolylene group.

3. The polymer of claim 1, wherein Ar is selected from a phenylene group, a $C_1$-$C_{10}$ alkylphenylene group, a di($C_1$-$C_{10}$ alkyl)phenylene group, a ($C_6$-$C_{14}$ aryl)phenylene group, a di($C_6$-$C_{14}$ aryl)phenylene group, a carbazolylene group, a $C_1$-$C_{10}$ alkylcarbazolylene group, a di($C_1$-$C_{10}$ alkyl)carbazolylene group, a $C_6$-$C_{14}$ arylcarbazolylene group, a di($C_6$-$C_{14}$ aryl)carbazolylene group, a fluorenylene group, a $C_1$-$C_{10}$ alkylfluorenylene group, a di($C_1$-$C_{10}$ alkyl)fluorenylene group, a ($C_6$-$C_{14}$ aryl)fluorenylene group, a di($C_6$-$C_{14}$ aryl)fluorenylene group, a naphthylene group, a $C_1$-$C_{10}$ alkylnaphthylene group, a di($C_1$-$C_{10}$ alkyl)naphthylene group, a ($C_6$-$C_{14}$ aryl)naphthylene group, a di($C_6$-$C_{14}$ aryl)naphthylene group, an anthrylene group, a $C_1$-$C_{10}$ alkylanthrylene group, a di($C_1$-$C_{10}$ alkyl)anthrylene group, a ($C_6$-$C_{14}$ aryl)anthrylene group, a di($C_6$-$C_{14}$ aryl)anthrylene group, a phenanthrenylene group, a $C_1$-$C_{10}$ alkylphenanthrenylene group, a di($C_1$-$C_{10}$ alkyl)phenanthrenylene group, a ($C_6$-$C_{14}$ aryl)phenanthrenylene group, a di($C_6$-$C_{14}$ aryl)phenanthrenylene group, a pyridinylene group, a $C_1$-$C_{10}$ alkylpyridinylene group, a di($C_1$-$C_{10}$ alkyl)pyridinylene group, a ($C_6$-$C_{14}$ aryl)pyridinylene group, a di($C_6$-$C_{14}$ aryl)pyridinylene group, a quinolinylene group, a $C_1$-$C_{10}$ alkylquinolinylene group, a di($C_1$-$C_{10}$ alkyl)quinolinylene group, a ($C_6$-$C_{14}$ aryl) quinolinylene group, a di($C_6$-$C_{14}$ aryl)quinolinylene group, a benzoimidazolylene group, a $C_1$-$C_{10}$ alkylbenzoimidazolylene group, a di($C_1$-$C_{10}$ alkyl)benzoimidazolylene group, a ($C_6$-$C_{14}$ aryl)benzoimidazolylene group, a di($C_6$-$C_{14}$ aryl)benzoimidazolylene group, an imidazopyridinylene group, a $C_1$-$C_{10}$ alkylimidazopyridinylene group, a di($C_1$-$C_{10}$ alkyl)imidazopyridinylene group, a ($C_6$-$C_{14}$ aryl)imidazopyridinylene group, a di($C_6$-$C_{14}$aryl)imidazopyridinylene group, an imidazopyrimidinylene group, a $C_1$-$C_{10}$ alkylimidazopyrimidinylene group, a di($C_1$-$C_{10}$ alkyl) imidazopyrimidinylene group, a ($C_6$-$C_{14}$ aryl)imidazopyrimidinylene group, and a di($C_6$-$C_{14}$ aryl)imidazopyrimidinylene group.

4. The polymer of claim 1, wherein a is 1, 2, or 3.

5. The polymer of claim 1, wherein, in Formula 1, —(Ar)$_a$— is represented by one of Formulae 2A to 2K below:

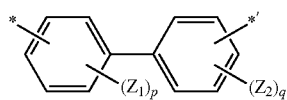

Formula 2A

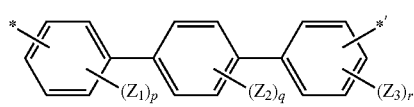

Formula 2B

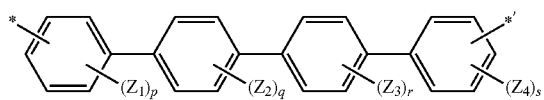

Formula 2C

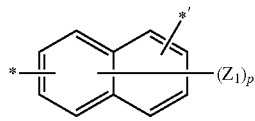

Formula 2D

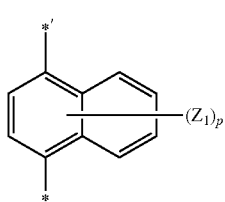

Formula 2E

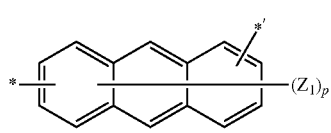

Formula 2F

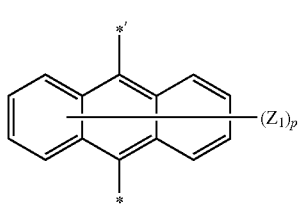

Formula 2G

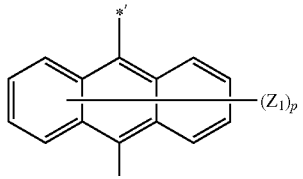

Formula 2H

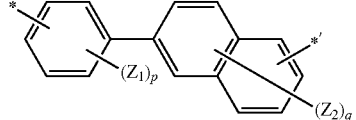

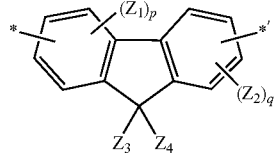

Formula 2I

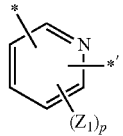

Formula 2J

Formula 2K wherein each of $Z_1$ to $Z_4$ is independently selected from a hydrogen atom, a $C_1$-$C_{10}$ alkyl group, and a $C_6$-$C_{14}$ aryl group; p, q, r and s are each independently an integer ranging from 1 to about 8; * indicates a binding site to N of an adjacent carbazole ring in Formula 1; and *' indicates a binding site to N of another adjacent carbazole ring in Formula 1.

6. The polymer of claim 1, wherein each of $R_1$ to $R_{14}$ and $R_{21}$ to $R_{27}$ is independently selected from a hydrogen atom, a halogen atom, a hydroxyl group, an amino group, a cyano group, a carboxylic acid group, a substituted or unsubstituted $C_1$-$C_{10}$ alkyl group, a substituted or unsubstituted $C_2$-$C_{10}$ alkenyl group, a substituted or unsubstituted $C_2$-$C_{10}$ alkynyl group, a substituted or unsubstituted $C_1$-$C_{10}$ alkoxy group, a substituted or unsubstituted $C_6$-$C_{14}$ aryl group and a substituted or unsubstituted $C_3$-$C_{14}$ heteroaryl group.

7. The polymer of claim 1, wherein each of $R_1$ to $R_2$, $R_4$ to $R_{11}$, $R_{13}$ to $R_{14}$, and $R_{22}$ to $R_{27}$ is a hydrogen atom; and each of $R_3$, $R_{12}$, and $R_{21}$ is independently selected from a hydrogen atom, a halogen atom, a hydroxyl group, an amino group, a cyano group, a carboxylic acid group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_6$-$C_{30}$ aryl group, a substituted or unsubstituted $C_3$-$C_{30}$ heteroaryl group, a group represented by —N($Q_1$)($Q_2$), and a group represented by —Si($Q_3$)($Q_4$)($Q_5$), wherein each of $Q_1$ to $Q_5$ is independently selected from the group consisting of a hydrogen atom, a halogen atom, a hydroxyl group, an amino group, a cyano group, a carboxylic acid group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_6$-$C_{30}$ aryl group, and a substituted or unsubstituted $C_3$-$C_{30}$ heteroaryl group.

8. The polymer of claim 1, wherein each of $R_1$ to $R_{14}$ and $R_{22}$ to $R_{27}$ is a hydrogen atom; and $R_{21}$ is selected from a hydrogen atom, a halogen atom, a hydroxyl group, an amino group, a cyano group, a carboxylic acid group, a $C_1$-$C_{10}$ alkyl group, a $C_1$-$C_{10}$ alkoxy group, a $C_6$-$C_{14}$ aryl group, and a $C_3$-$C_{14}$ heteroaryl group.

9. The polymer of claim 1, wherein n is 1 or 2.

10. The polymer of claim 1, wherein the polymeric unit is represented by one of Formulae 1B and 1C below:

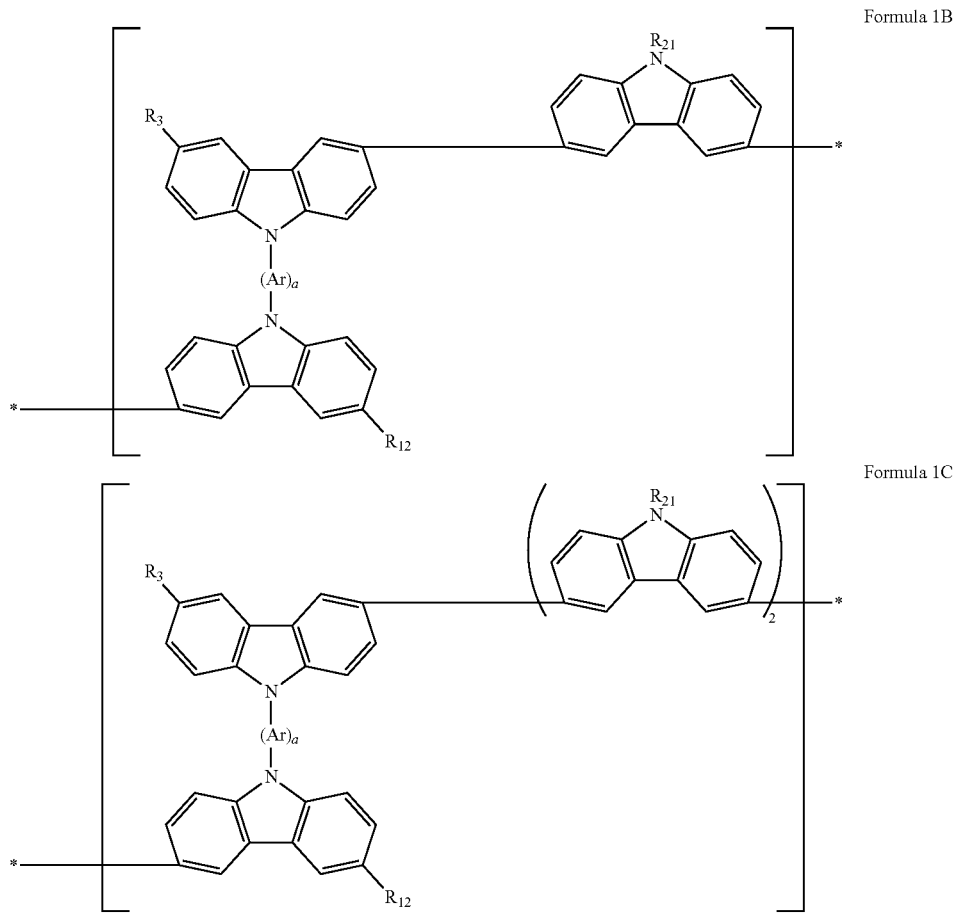

Formula 1B

Formula 1C wherein each Ar is independently selected from a substituted or unsubstituted $C_6$-$C_{30}$ arylene group and a substituted or unsubstituted $C_3$-$C_{30}$ heteroarylene group;

a is 1, 2, or 3;

each of $R_3$, $R_{12}$, and $R_{21}$ is independently selected from a hydrogen atom, a halogen atom, a hydroxyl group, an amino group, a cyano group, a carboxylic acid group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_6$-$C_{30}$ aryl group, a substituted or unsubstituted $C_3$-$C_{30}$ heteroaryl group, a group represented by —N($Q_1$)($Q_2$), and a group represented by —Si($Q_3$)($Q_4$)($Q_5$), wherein each of $Q_1$ to $Q_5$ is independently selected from a hydrogen atom, a halogen atom, a hydroxyl group, an amino group, a cyano group, a carboxylic acid group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_6$-$C_{30}$ aryl group, and a substituted or unsubstituted $C_3$-$C_{30}$ heteroaryl group.

11. The polymer of claim 10, wherein, in Formulae 1B and 1C, —(Ar)$_a$— is represented by one of Formulae 2A to 2K below:

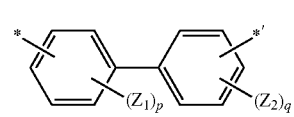

Formula 2A

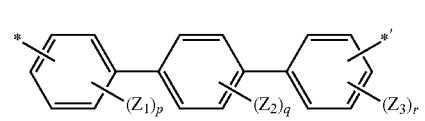

Formula 2B

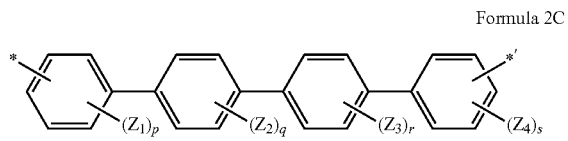

Formula 2C

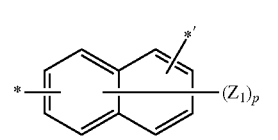

Formula 2D

Formula 2E

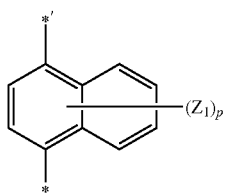

Formula 2F

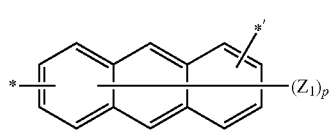

Formula 2G

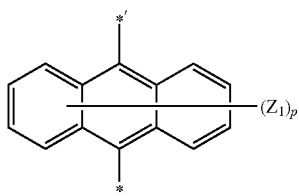

Formula 2H

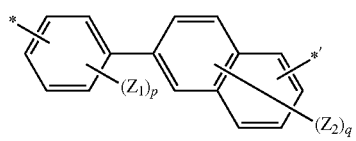

Formula 2I

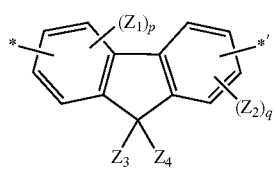

Formula 2J

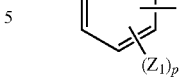

Formula 2K

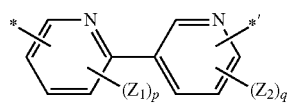

wherein each of $Z_1$ to $Z_4$ is independently selected from a hydrogen atom, a $C_1$-$C_{10}$ alkyl group, and a $C_6$-$C_{14}$ aryl group; each of p, q, r and s is independently an integer ranging from 1 to about 8; * indicates a binding site to N of an adjacent carbazole ring in Formula 1; and *' indicates a binding site to N of another adjacent carbazole ring in Formula 1.

12. The polymer of claim 10, wherein, in Formulae 1B and 1C, each of $R_3$, $R_{12}$, and $R_{21}$ is independently selected from a hydrogen atom, a halogen atom, a hydroxyl group, an amino group, a cyano group, a carboxylic acid group, a $C_1$-$C_{10}$ alkyl group, a $C_1$-$C_{10}$ alkoxy group, a $C_6$-$C_{14}$ aryl group, and a $C_3$-$C_{14}$ heteroaryl group.

13. The polymer of claim 10, wherein, in Formulae 1B and 1C, each of $R_3$, $R_{12}$, and $R_{21}$ is independently selected from a hydrogen atom, a methyl group, an ethyl group, a linear or branched propyl group, a linear or branched butyl group, a linear or branched pentyl group, a linear or branched hexyl group, a linear or branched heptyl group and a linear or branched octyl group.

14. The polymer of claim 1, having a weight average molecular weight ranging from about 2,000 to about 1,000,000.

15. The polymer of claim 1, having bipolar characteristics.

16. An organic light-emitting device comprising a substrate; a first electrode; a second electrode; and a first layer disposed between the first electrode and the second electrode, the first layer comprising the polymer of claim 1.

17. The organic light emitting device of claim 16, wherein the first layer is an emission layer, and further comprises a phosphorescent dopant.

18. The organic light emitting device of claim 17, wherein the phosphorescent dopant comprises an organometallic complex including at least one metal selected from iridium (Ir), platinum (Pt), osmium (Os), rhenium (Re), titanium (Ti), zirconium (Zr), hafnium (Hf), and a combination thereof.

19. The organic light emitting device of claim 17, wherein the amount of the phosphorescent dopant is in the range of about 1 wt % to about 10 wt %.

20. The organic light emitting device of claim 16, further comprising, between the first electrode and the second electrode, at least one layer selected from a hole injection layer, a hole transport layer, an emission layer, a hole blocking layer, an electron transport layer, and an electron injection layer.

21. A polymer comprising a polymeric unit represented by Formula 1 below:

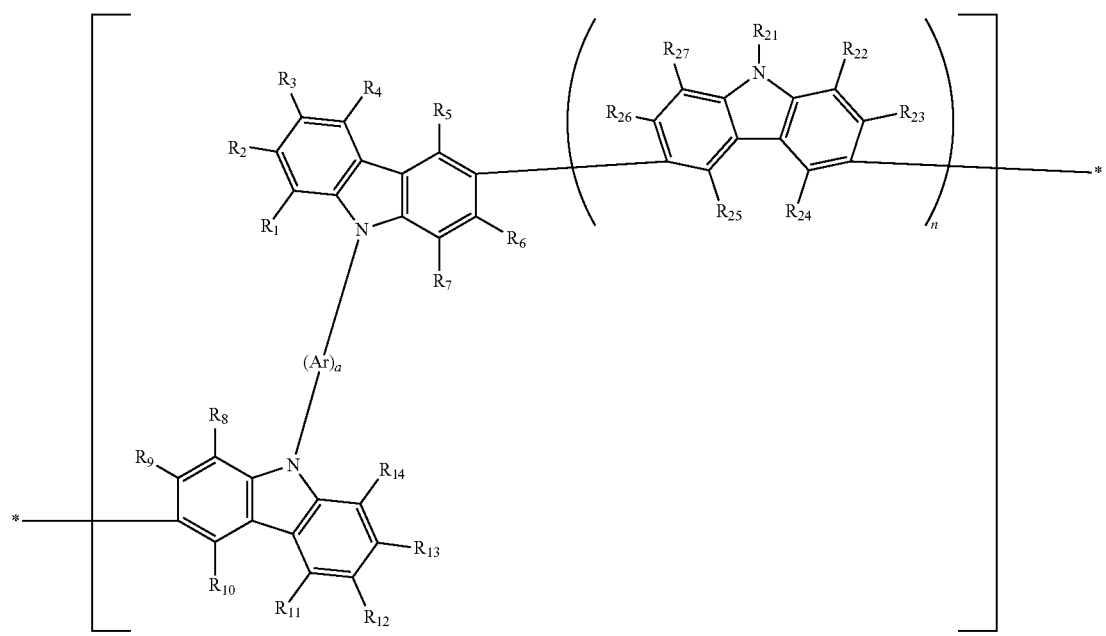

Formula 1 wherein each Ar is independently selected from a substituted or unsubstituted pentalenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene group, a substituted or unsubstituted phenalenylene group, a substituted or unsubstituted phenanthrenylene group, a substituted or unsubstituted anthracenylene group, a substituted or unsubstituted fluoranthenylene group, a substituted or unsubstituted triphenylenylene group, a substituted or unsubstituted pyrenylenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentaphenylene group, a substituted or unsubstituted hexacenylene group, a substituted or unsubstituted pyrrolylene group, a substituted or unsubstituted pyrazolylene group, a substituted or unsubstituted imidazolylene group, a substituted or unsubstituted imidazolinylene group, a substituted or unsubstituted imidazopyridinylene group, a substituted or unsubstituted imidazopyrimidinylene group, a substituted or unsubstituted pyridinylene group, a substituted or unsubstituted pyrazinylene group, a substituted or unsubstituted pyrimidinylene group, a substituted or unsubstituted indolylene group, a substituted or unsubstituted purinylene group, a substituted or unsubstituted quinolinylene group, a substituted or unsubstituted phthalazinylene group, a substituted or unsubstituted indolizinylene group, a substituted or unsubstituted napththyridinylene group, a substituted or unsubstituted quinazolinylene group, a substituted or unsubstituted cinnolinylene group, a substituted or unsubstituted indazolylene group, a substituted or unsubstituted carbzolylene group, a substituted or unsubstituted phenazinylene group, a substituted or unsubstituted phenanthridinylene group, a substituted or unsubstituted pyranylene group, a substituted or unsubstituted chromenylene group, a substituted or unsubstituted pyranylene group, a substituted or unsubstituted chromenylene group, a substituted or unsubstituted benzofuranylene group, a substituted or unsubstituted benzothiophenylene group, a substituted or unsubstituted isothiazolylene group, a substituted or unsubstituted benzoimidazolylene group, and a substituted or unsubstituted isoxazolylene group;

a is an integer ranging from 1 to about 3;

each of $R_1$, $R_2$, $R_4$ to $R_{11}$, $R_{13}$ and $R_{14}$ is independently selected from a hydrogen atom, a halogen atom, a hydroxyl group, an amino group, a cyano group, a carboxylic acid group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_6$-$C_{30}$ aryl group, a substituted or unsubstituted $C_3$-$C_{30}$ heteroaryl group, a group represented by —N($Q_1$)($Q_2$), and a group represented by —Si($Q_3$)($Q_4$)($Q_5$), wherein each of $Q_1$ to $Q_5$ is independently selected from a hydrogen atom, a halogen atom, a hydroxyl group, an amino group, a cyano group, a carboxylic acid group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_6$-$C_{30}$ aryl group, and a substituted or unsubstituted $C_3$-$C_{30}$ heteroaryl group;

each of $R_3$ and $R_{12}$ is independently selected from a hydrogen atom, a chlorine atom, a bromine atom, an iodine atom, a hydroxyl group, an amino group, a carboxylic acid group, a substituted or unsubstituted $C_2$-$C_{30}$ alkenyl group, a substituted or unsubstituted $C_2$-$C_{30}$ alkynyl group, a substituted or unsubstituted $C_3$-$C_{30}$ heteroaryl group, a group represented by —N($Q_1$)($Q_2$), and a group represented by —Si($Q_3$)($Q_4$)($Q_5$), wherein each of $Q_1$ to $Q_5$ is independently selected from a hydrogen atom, a halogen atom, a hydroxyl group, an amino group, a cyano group, a carboxylic acid group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_6$-$C_{30}$ aryl group, and a substituted or unsubstituted $C_3$-$C_{30}$ heteroaryl group;

n is 0; and each "*" indicates a point of attachment to the same or a different polymeric unit represented by Formula 1.

22. The polymer of claim 21, wherein Ar is selected from a carbazolylene group, a $C_1$-$C_{10}$ alkylcarbazolylene group, a di($C_1$-$C_{10}$ alkyl)carbazolylene group, a $C_6$-$C_{14}$ arylcarbazolylene group, a di($C_6$-$C_{14}$ aryl)carbazolylene group, a fluorenylene group, a $C_1$-$C_{10}$ arylfluorenylene group, a di($C_1$-$C_{10}$ alkyl)fluorenylene group, a ($C_6$-$C_{14}$ aryl)fluorenylene group, a di($C_6$-$C_{14}$ aryl)fluorenylene group, a naphthylene group, a $C_1$-$C_{10}$ alkylnaphthylene group, a di($C_1$-$C_{10}$ alkyl)naphthylene group, a ($C_6$-$C_{14}$ aryl)naphthylene group, a di($C_6$-$C_{14}$ aryl)naphthylene group, an anthrylene group, a $C_1$-$C_{10}$ alkylanthrylene group, a di($C_1$-$C_{10}$ alkyl)anthrylene group, a ($C_6$-$C_{14}$ aryl)anthrylene group, a di($C_6$-$C_{14}$ aryl)anthrylene group, a phenanthrenylene group, a $C_1$-$C_{10}$ alkylphenanthrenylene group, a di($C_1$-$C_{10}$ alkyl)phenanthrenylene group, a ($C_6$-$C_{14}$ aryl)phenanthrenylene group, a di($C_6$-$C_{14}$ aryl) phenanthrenylene group, a pyrindinylene group, a $C_1$-$C_{10}$ alklpyrindinylene group, a di($C_1$-$C_{10}$ alkyl)pyridinylene group, a ($C_6$-$C_{14}$ aryl)pyridinylene group, a di($C_6$-$C_{14}$ aryl) pyridinylene group, a quinolinylene group, a $C_1$-$C_{10}$ alkylquinolinylene group, a di($C_1$-$C_{10}$ alkyl)quinolinylene group, a ($C_6$-$C_{14}$ aryl)quinolinylene group, a di($C_6$-$C_{14}$aryl)quinolinylene group, a benzoimidazolylene group, a $C_1$-$C_{10}$ alkylbenzoimidazolylene group, a di($C_1$-$C_{10}$ alkyl)benzoimidazolylene group, a ($C_6$-$C_{14}$ aryl)benzoimidazolylene group, a di($C_6$-$C_{14}$ aryl(benzoimidazolylene group, an imidazopyridinylene group, a $C_1$-$C_{10}$ alkylimidazopyridinylene group, a di($C_1$-$C_{10}$ alkyl)imidazopyridinylene group a ($C_6$-$C_{14}$ aryl) imidazopyridinylene group, a di($C_6$-$C_{14}$aryl)imidazopyridinylene group, an imidazopyrimidinylene group, a $C_1$-$C_{10}$ alkylimidazopyrimidinylene group, a di($C_1$-$C_{10}$ alkyl) imidazopyrimidinylene group, a ($C_6$-$C_{14}$ aryl)imidazopyrimidinylene group, and a di($C_6$-$C_{14}$ aryl)imidaopyrimidinylene group.

23. The polymer of claim 21, wherein a is 1, 2, or 3.

24. The polymer of claim 21, wherein, in Formula 1, —(Ar)$_a$— is represented by one of Formulae 2D to 2K below:

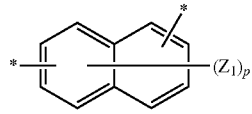

Formula 2D

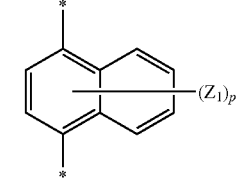

Formula 2E

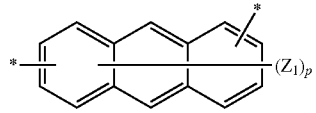

Formula 2F

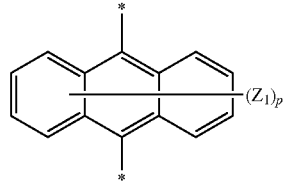

Formula 2G

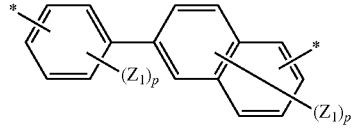

Formula 2H

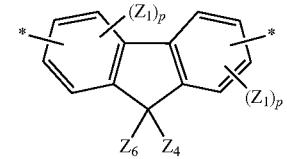

Formula 2I

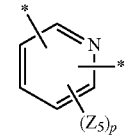

Formula 2J

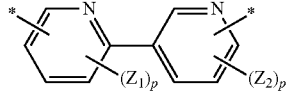

Formula 2K wherein each of $Z_1$ to $Z_4$ is independently selected from a hydrogen atom, a $C_1$-$C_{10}$ alkyl group, and a $C_6$-$C_{14}$ aryl group; p, q, r and s are each independently an integer ranging from 1 to about 8; * indicates a binding site to N of an adjacent carbazole ring in Formula 1; and *' indicates a binding site to N of another adjacent carbazole ring in Formula 1.

25. The polymer of claim 21, wherein each of $R_1$, $R_2$, $R_4$ to $R_{11}$, $R_{13}$ and $R_{14}$ is independently selected from a hydrogen atom, a halogen atom, a hydroxyl group, an amino group, a cyano group, a carboxylic acid group, a substituted or unsubstituted $C_1$-$C_{10}$ alkyl group, a substituted or unsubstituted $C_2$-$C_{10}$ alkenyl group, a substituted or unsubstituted $C_2$-$C_{10}$ alkynyl group, a substituted or unsubstituted $C_1$-$C_{10}$ alkoxy group, a substituted or unsubstituted $C_6$-$C_{14}$ aryl group and a substituted or unsubstituted $C_3$-$C_{14}$ heteroaryl group; and each of $R_3$ and $R_{12}$ is independently selected from a hydrogen atom, a halogen atom, a hydroxyl group, an amino group, a cyano group, a carboxylic acid group, a substituted or unsubstituted $C_2$-$C_{10}$ alkenyl group, a substituted or unsubstituted $C_2$-$C_{10}$ alkynyl group and a substituted or unsubstituted $C_3$-$C_{14}$ heteroaryl group.

26. The polymer of claim 21, wherein each of $R_1$ to $R_2$, $R_4$ to $R_{11}$, $R_{13}$ and $R_{14}$ is a hydrogen atom; and each of $R_3$ and $R_{12}$ is independently selected from a hydrogen atom, a halogen atom, a hydroxyl group, an amino group, a cyano group, a carboxylic acid group, a substituted or unsubstituted $C_2$-$C_{30}$ alkenyl group, a substituted or unsubstituted $C_2$-$C_{30}$ alkynyl group, a substituted or unsubstituted $C_3$-$C_{30}$ heteroaryl group, a group represented by —$N(Q_1)(Q_2)$, and a group represented by —$Si(Q_3)(Q_4)(Q_5)$, wherein each of $Q_1$ to $Q_5$ is independently selected from the group consisting of a hydrogen atom, a halogen atom, a hydroxyl group, an amino group, a cyano group, a carboxylic acid group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_6$-$C_{30}$ aryl group, and a substituted or unsubstituted $C_3$-$C_{30}$ heteroaryl group.

27. The polymer of claim 21, wherein each of $R_1$ to $R_{14}$ is a hydrogen atom.

28. The polymer of claim 21, wherein the polymer unit is represented by one of Formula 1A below:

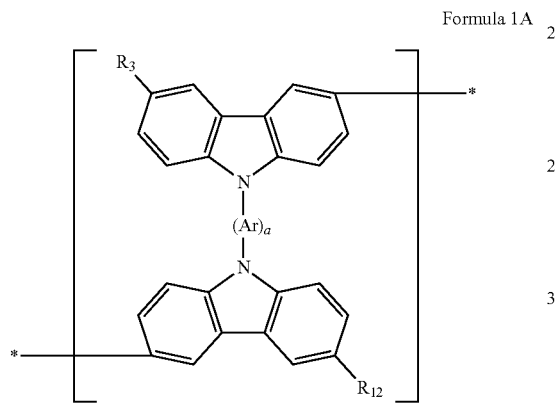

Formula 1A wherein each Ar is independently selected from a substituted or unsubstituted pentalenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene group, a substituted or unsubstituted phenalenylene group, a substituted or unsubstituted phenanthrenylene group, a substituted or unsubstituted anthracenylene group, a substituted or unsubstituted fluoranthenylene group, a substituted or unsubstituted triphenylenylene group, a substituted or unsubstituted pyrenylenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentaphenylene group, a substituted or unsubstituted hexacenylene group, a substituted or unsubstituted pyrrolylene group, a substituted or unsubstituted pyrazolylene group, a substituted or unsubstituted imidazolylene group, a substituted or unsubstituted imidazolinylene group, a substituted or unsubstituted imidazopyridinylene group, a substituted or unsubstituted imidazopyrimidinylene group, a substituted or unsubstituted pyridinylene group, a substituted or unsubstituted pyrazinylene group, a substituted or unsubstituted pyrimidinylene group, a substituted or unsubstituted indolylene group, a substituted or unsubstituted purinylene group, a substituted or unsubstituted quinolinylene group, a substituted or unsubstituted phthalazinylene group, a substituted or unsubstituted indolizinylene group, a substituted or unsubstituted naphthyridinylene group, a substituted or unsubstituted quinazolinylene group, a substituted or unsubstituted cinnolinylene group, a substituted or unsubstituted indazolylene group, a substituted or unsubstituted carbazolylene group, a substituted or unsubstituted phenazinylene group, a substituted or unsubstituted phenanthridinylene group, a substituted or unsubstituted pyranylene group, a substituted or unsubstituted chromenylene group, a substituted or unsubstituted benzofuranylene group, a substituted or unsubstituted benzothiophenylene group, a substituted or unsubstituted isothiazolylene group, a substituted or unsubstituted benzoimidazolylene group, and a substituted or unsubstituted isoxazolylene group;

a is 1, 2, or 3;

each of $R_3$ and $R_{12}$ is independently selected from a hydrogen atom, a chlorine atom, a bromine atom, an iodine atom, a hydroxyl group, an amino group, a carboxylic acid group, a substituted or unsubstituted $C_2$-$C_{30}$ alkenyl group, a substituted or unsubstituted $C_2$-$C_{30}$ alkynyl group, a substituted or unsubstituted $C_3$-$C_{30}$ heteroaryl group, a group represented by —$N(Q_1)(Q_2)$, and a group represented by —$Si(Q_3)(Q_4)(Q_5)$, wherein each of $Q_1$ to $Q_5$ is independently selected from a hydrogen atom, a halogen atom, a hydroxyl group, an amino group, a cyano group, a carboxylic acid group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_6$-$C_{30}$ aryl group, and a substituted or unsubstituted $C_3$-$C_{30}$ heteroaryl group.

29. The polymer of claim 28, wherein, in Formula 1A, —$(Ar)_a$— is represented by one of Formulae 2D to 2K below:

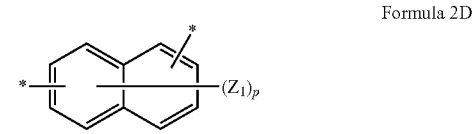

Formula 2D

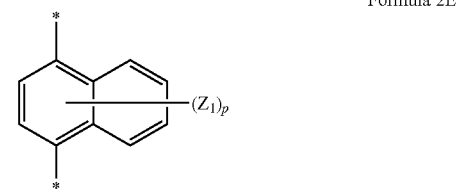

Formula 2E

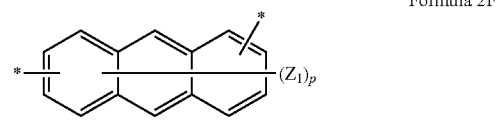

Formula 2F

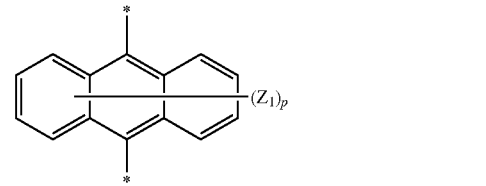

Formula 2G

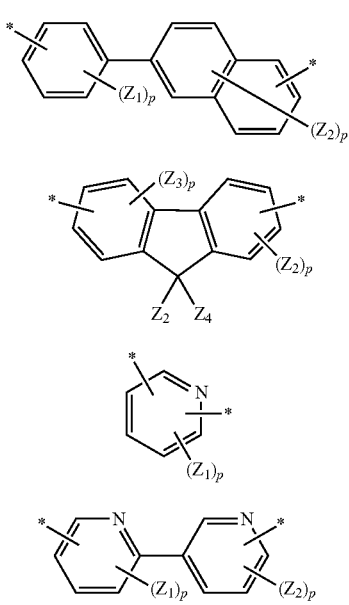

wherein each of $Z_1$ to $Z_4$ is independently selected from a hydrogen atom, a $C_1$-$C_{10}$ alkyl group, and a $C_6$-$C_{14}$ aryl group; p, q, r and s are each independently an integer ranging from 1 to about 8; * indicates a binding site to N of an adjacent carbazole ring in Formula 1; and *' indicates a binding site to N of another adjacent carbazole ring in Formula 1.

30. The polymer of claim 28, wherein, in Formula 1A, each of $R_3$ and $R_{12}$ is independently selected from a hydrogen atom, a chlorine atom, a bromine atom, a hydroxyl group, an amino group, a carboxylic acid group and a $C_3$-$C_{14}$ heteroaryl group.

31. The polymer of claim 28, wherein, in Formula 1A, each of $R_3$ and $R_{12}$ is a hydrogen atom.

32. The polymer of claim 21, having a weight average molecular weight ranging from about 2,000 to about 1,000,000.

33. The polymer of claim 21, having bipolar characteristics.

34. An organic light-emitting device comprising a substrate; a first electrode; a second electrode; and a first layer disposed between the first electrode and the second electrode, the first layer comprising the polymer of claim 21.

35. The organic light emitting device of claim 34, wherein the first layer is an emission layer, and further comprises a phosphorescent dopant.

36. The organic light emitting device of claim 35, wherein the phosphorescent dopant comprises an organometallic complex including at least one metal selected from iridium (Ir), platinum (Pt), osmium (Os), rhenium (Re), titanium (Ti), zirconium (Zr), hafnium (Hf), and a combination thereof.

37. The organic light emitting device of claim 35, wherein the amount of the phosphorescent dopant is in the range of about 1 wt % to about 10 wt %.

38. The organic light emitting device of claim 34, further comprising, between the first electrode and the second electrode, at least one layer selected from a hole injection layer, a hole transport layer, an emission layer, a hole blocking layer, an electron transport layer, and an electron injection layer.

* * * * *